United States Patent
Andreopoulos

(10) Patent No.: US 11,537,855 B2
(45) Date of Patent: Dec. 27, 2022

(54) LOW SPIKE COUNT RING BUFFER MECHANISM ON NEUROMORPHIC HARDWARE

(71) Applicant: INTERNATIONAL BUSINESS MACHINES CORPORATION, Armonk, NY (US)

(72) Inventor: Alexander Andreopoulos, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 975 days.

(21) Appl. No.: 16/140,269

(22) Filed: Sep. 24, 2018

(65) Prior Publication Data
US 2020/0097801 A1 Mar. 26, 2020

(51) Int. Cl.
*G06N 3/06* (2006.01)
*G06N 3/04* (2006.01)
*G11C 11/54* (2006.01)

(52) U.S. Cl.
CPC .............. *G06N 3/06* (2013.01); *G06N 3/049* (2013.01); *G11C 11/54* (2013.01)

(58) Field of Classification Search
CPC ..................................................... G06N 3/06
USPC ........................................................ 717/27
See application file for complete search history.

(56) References Cited

U.S. PATENT DOCUMENTS

| | | | | |
|---|---|---|---|---|
| 5,119,368 A * | 6/1992 | Hiltner | ................... | H04Q 11/08 370/376 |
| 5,826,041 A * | 10/1998 | Ogus | ........................ | G06F 5/12 709/234 |
| 8,694,449 B2 | 4/2014 | Weng et al. | | |
| 8,843,425 B2 | 9/2014 | Modha | | |
| 9,412,064 B2 | 8/2016 | Szatmary et al. | | |
| 9,904,983 B2 | 2/2018 | Andreopoulos et al. | | |
| 10,726,337 B1 * | 7/2020 | Thibeault | ................. | G06N 3/08 |
| 2006/0056407 A1 * | 3/2006 | Hashimoto | .......... | H04N 21/434 370/389 |
| 2015/0046381 A1 * | 2/2015 | Malone | .................... | G06N 3/02 706/15 |

(Continued)

OTHER PUBLICATIONS

C. Sichonidis, I. Vourkas, N. Mitianoudis and G. C. Sirakoulis, "A memristive circular buffer for real-time signal processing," 2016 5th International Conference on Modern Circuits and Systems Technologies (MOCAST), 2016, pp. 1-4, doi: 10.1109/MOCAST.2016. 7495153. (Year: 2016).*

(Continued)

*Primary Examiner* — James D. Rutten
(74) *Attorney, Agent, or Firm* — Erik A. Huestis; Stephen J. Kenny; Foley Hoag, LLP

(57) ABSTRACT

Low spike count ring buffer mechanisms on neuromorphic hardware are provided. A ring buffer comprises a plurality of memory cells. The plurality of memory cells comprises one or more neurosynaptic core. A demultiplexer is operatively coupled to the ring buffer. The demultiplexer is adapted to receive input comprising a plurality of spikes, and write sequentially to each of the plurality of memory cells. A plurality of output connectors is operatively coupled to the ring buffer. Each of the plurality of output connectors is adapted to provide an output based on contents of a subset of the plurality of memory cells.

21 Claims, 24 Drawing Sheets

(56) References Cited

U.S. PATENT DOCUMENTS

| | | | |
|---|---|---|---|
| 2015/0206050 A1* | 7/2015 | Talathi | G06N 3/082 706/25 |
| 2015/0324684 A1* | 11/2015 | Alvarez-Icaza Rivera | G06N 3/04 706/26 |
| 2015/0339570 A1* | 11/2015 | Scheffler | G06N 3/04 706/16 |
| 2016/0096270 A1* | 4/2016 | Ibarz Gabardos | B25J 9/161 700/253 |
| 2016/0132766 A1 | 5/2016 | Adams et al. | |
| 2017/0116513 A1* | 4/2017 | Andreopoulos | G06N 3/063 |
| 2018/0314927 A1* | 11/2018 | Muralimanohar | G06N 3/063 |
| 2019/0138900 A1* | 5/2019 | Linares-Barranco | G06N 3/08 |
| 2019/0303743 A1* | 10/2019 | Venkataramani | G06F 9/30145 |

OTHER PUBLICATIONS

Abigail Morrison, Carsten Mehring, Theo Geisel, Theo Geisel AD Aertsen, and Markus AD Diesmann. 2005. Advancing the Boundaries of High-Connectivity Network Simulation with Distributed Computing. Neural Comput. 17, 8 (Aug. 2005), 1776-1801. https://doi.org/10.1162/0899766054026648 (Year: 2005).*

A. S. Cassidy et al., "Cognitive computing building block: A versatile and efficient digital neuron model for neurosynaptic cores," The 2013 International Joint Conference on Neural Networks (IJCNN), 2013, pp. 1-10, doi: 10.1109/IJCNN.2013.6707077. (Year: 2013).*

Van Albada SJ, Rowley AG, Senk J, Hopkins M, Schmidt M, Stokes AB, Lester DR, Diesmann M, Furber SB. Performance Comparison of the Digital Neuromorphic Hardware SpiNNaker and the Neural Network Simulation Software NEST for a Full-Scale Cortical Microcircuit Model. Front Neurosci. May 23, 2018;12:291. (Year: 2018).*

A. Andreopoulos, H. J. Kashyap, T. K. Nayak, A. Amir and M. D. Flickner, "A Low Power, High Throughput, Fully Event-Based Stereo System," 2018 IEEE/CVF Conference on Computer Vision and Pattern Recognition, 2018, pp. 7532-7542, doi: 10.1109/CVPR.2018.00786. (Year: 2018).*

Anonymous, "Lockless Circular Buffer Over Shared Memory (High Speed Data Transfer via Shared Memory)," IP.com, (2013).

IBM, "Command Execution Sequence with Customization priority in Character-Based User Interface," IP.com, (2008).

IBM, "Mechanism to Control and Vary Size of Curcular Buffers," IP.com (2008).

Muller, "Novel Operation Modes of Accelerated Neuromorphic Hardware," Dissertation, (2014).

Schmitt et al., "Neuromorphic Hardware in the Loop: Training a Deep Spiking Network on the BrainScaleS Wafer-Scale System," Heidelberg University, (2017).

* cited by examiner left · right left · right left        right left        right

LOW SPIKE COUNT RING BUFFER MECHANISM ON NEUROMORPHIC HARDWARE

This invention was made with Government support under Contract No. W911NF-15-2-0130 awarded by the U.S. Army. The Government has certain rights in this invention.

BACKGROUND

Embodiments of the present disclosure relate to neuromorphic hardware, and more specifically, to low spike count ring buffer mechanisms.

BRIEF SUMMARY

According to embodiments of the present disclosure, systems for low spike count ring buffers on neuromorphic hardware are provided. A ring buffer comprises a plurality of memory cells. The plurality of memory cells comprise one or more neurosynaptic core. A demultiplexer is operatively coupled to the ring buffer. The demultiplexer is adapted to receive input comprising a plurality of spikes, and write sequentially to each of the plurality of memory cells. A plurality of output connectors is operatively coupled to the ring buffer. Each of the plurality of output connectors is adapted to provide an output based on contents of a subset of the plurality of memory cells.

In some embodiments, the ring buffer is configurable at runtime. In some embodiments, the number of memory cells in the ring buffer is configurable at runtime.

In some embodiments, the system is configured to retain input data for a predetermined number of ticks. In some embodiments, the predetermined number of ticks is configurable at runtime.

In some embodiments, the system is configured to produce an input window at a predetermined frequency. In some embodiments, the predetermined frequency is configurable at runtime.

In some embodiments, the system is configured to simultaneously output a predetermined number of prior windows. In some embodiments, the predetermined number is configurable at runtime.

In some embodiments, the input size is configurable at runtime.

In some embodiments, the writing includes a predetermined delay. In some embodiments, the predetermined delay is configurable at runtime.

According to embodiments of the present disclosure, methods of and computer program products for buffering on neurosynaptic hardware are provided. Input comprising a plurality of spikes is received at a demultiplexer. The demultiplexer writes sequentially to each of a plurality of memory cells of a ring buffer. The plurality of memory cells comprise one or more neurosynaptic core. An output is provided based on contents of a subset of the plurality of memory cells at a plurality of output connectors.

DETAILED DESCRIPTION

Figure 1:
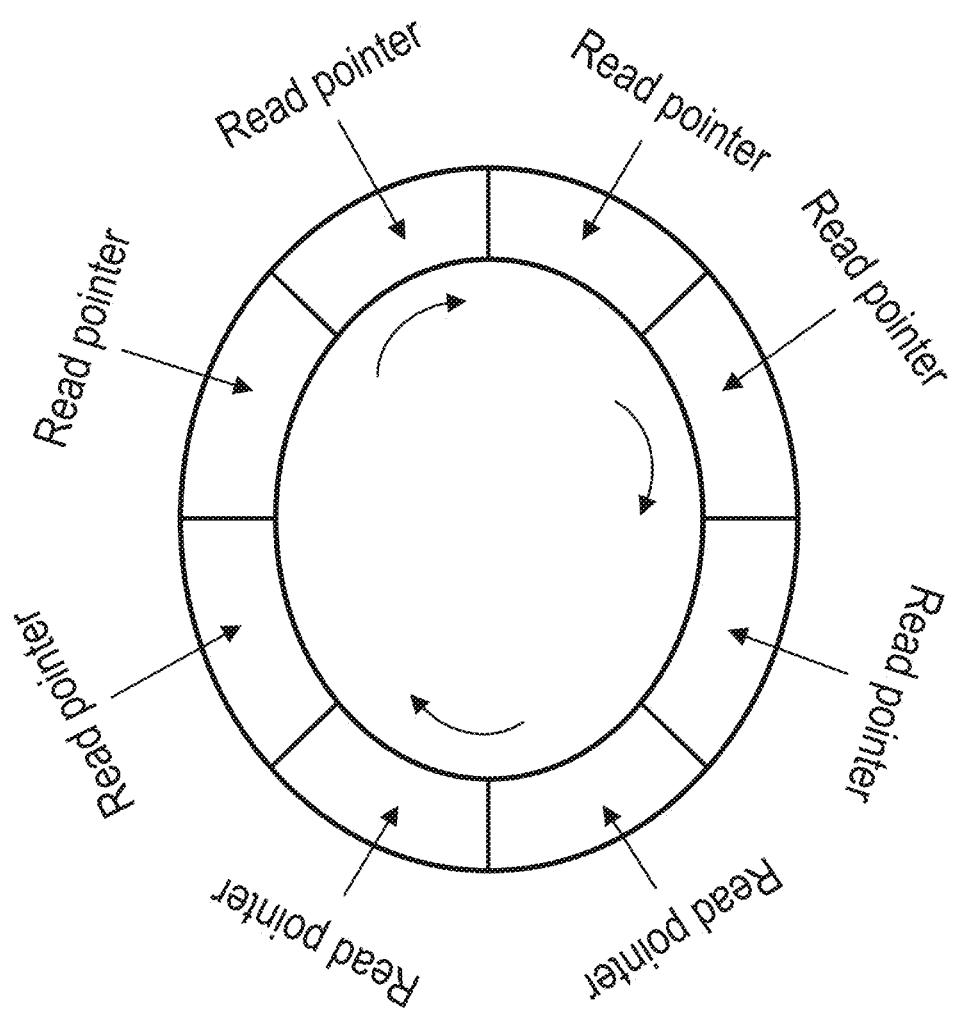
FIG. 1 depicts a ring buffer according to embodiments of the present disclosure.

A ring buffer, which may be referred to as a circular buffer, circular queue, cyclic buffer, or ring buffer, is a data structure that uses a single, fixed-size buffer as if it were connected end-to-end. This data structure lends itself easily to buffering data streams, in addition to other applications where a FIFO buffer is required. A ring buffer is also useful to implement queues of fixed maximum size. Although various exemplary applications are described herein, it will be appreciated that a ring buffer is a useful building block for a variety of additional applications.

Arrays of extremely low power neurosynaptic processing units, called neurosynaptic cores, provide an architecture to solve exascale big data problems. These cores use spikes to encode information. In a network of neurosynaptic cores, neurons on each core can connect to any axon of any other neurosynaptic core (including itself). When a neuron spikes, it sends a spike packet that gets delivered to a target axon on a destination core.

In digital spiking neuromorphic systems, information is represented and delivered by spikes, where each spike is a digital packet of information, carrying one or more bits. For example, the IBM TrueNorth chip is a digital spiking neuromorphic system where each spike carries a single bit of information (a binary spike). Spiking neural networks such as TrueNorth are based on delivering packets of information over switched communication wires, thereby significantly reducing the required wiring. The presence of a spike is treated as receiving a 1, its absence represents a 0. More values can be coded into binary spikes using several different spike coding schemas.

A spike communication from a source neuron on a source core, to a target axon on a destination core, would effectively need to traverse certain number of hops via routers in a 2D grid in either the horizontal or vertical or a combination of both to be delivered to the target axon on a destination core. Each hop a spike packet traverses, consumes power and energy.

Within an exemplary neuromorphic system such as TrueNorth, a fixed amount of time is allowed for a spike to travel from its source neuron to its destination axon. This fixed window is referred to as a tick. The time a spike requires for its journey varies based on the distance the spike must travel and the number of 2-D mesh routing, chip and board interfaces that the spike travels across.

On each tick, the neurons in a core are processed sequentially, starting with the first neuron and continuing through the last neuron. Accordingly, in addition to the transmission delays discussed above, each spike is also delayed by some additional fixed amount based on which neuron on a core generated it. For example, in an exemplary neuromorphic system such as TrueNorth having 256 neurons per core, the 256th neuron is not processed until the preceding 255 neurons are processed.

According to various embodiments of the present disclosure, a neurosynaptic program represents a neurosynaptic network. A neurosynaptic program includes information relating to the neurosynaptic network. In some embodiments, the information includes neuronal properties and dynamics that determine an electronic neuron's response to input spikes. For example, neuronal properties and dynamics can include a threshold parameter, a leak parameter, a delay parameter, or a reset parameter. In some embodiments, the neurosynaptic program information includes synaptic connections of the neuron (e.g., synaptic connections made via a synaptic crossbar). In some embodiments, the neurosynaptic program information includes axon properties (e.g., axon types). In some embodiments, the neurosynaptic program information includes one or more destinations (e.g., target axons) that the neuron's output spike should be delivered to.

According to various embodiments, a neurosynaptic network represents an instantiation of a neurosynaptic program. A neurosynaptic network may be instantiated in hardware, in simulation or in both. For example, a neurosynaptic program may give rise to one or more instances of a neurosynaptic network, wherein the instances may reside on a single core, multiple cores, or multiple chips.

According to various embodiments, a neuromorphic core circuit represents an example neurosynaptic network described by a neurosynaptic program.

According to various embodiments, a corelet or a Corelet Programming Language represent software that provide abstraction of neurosynaptic programs. A composition of neurosynaptic programs may be created by composing corelets.

A TrueNorth program is a complete specification of a network of neurosynaptic cores, along with its external inputs and outputs. In various embodiments, a divide-and-conquer approach is adopted whereby a large network of neurosynaptic cores is constructed by interconnecting a set of smaller networks of neurosynaptic cores, where each of the smaller networks, in turn, could be constructed by interconnecting a set of even smaller networks, and so on, down to a network consisting of a single neurosynaptic core, which is the fundamental non-divisible building block. This programming paradigm is referred to as Corelet Programming.

Ring buffers are particularly useful in neuromorphic programming, in cases where streaming input data is provided. For example, consider input spikes produced from a dynamic vision sensor. For such applications it is necessary to maintain a sliding window of the recent past in order to accumulate a sufficient number of input spikes for a meaningful interpretation of the environment to occur. For example, this may be used in gesture detection and recognition systems where the classifier is fed multiple frames of the recent past representing the small sequence of hand motions that can be used to disambiguate the gesture. In another example, this may be used for stereo disparity algorithms to accumulate a sufficient number of spikes to obtain left-right correspondences. In another example, this may be used for Recurrent Neural Networks (RNNs) to obtain windows of the recent past, for example in sequence prediction tasks with text.

With reference now to FIG. 1, an exemplary ring buffer is illustrated. In this example, the buffer has eight elements. A read point (and likewise a write pointer) progresses in this example clockwise, traversing each element before completing the circle. It will be appreciated that a variety of implementation of a ring buffer may be adopted without departing from this conceptual framework.

Figure 2:
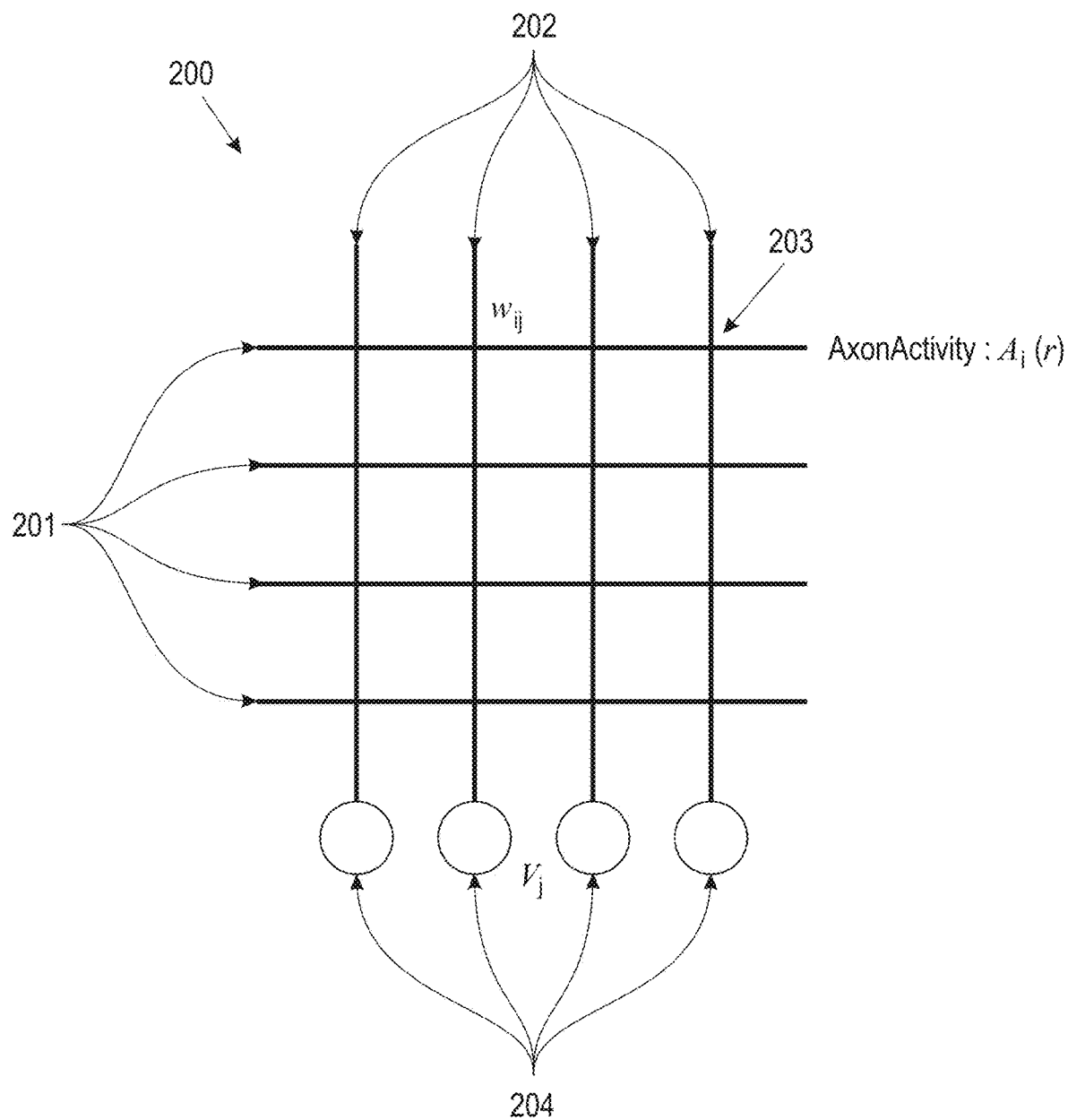
FIG. 2 depicts a neurosynaptic core according to embodiments of the present disclosure.

With reference now to FIG. 2, a neurosynaptic core according to embodiments of the present disclosure is depicted. In some embodiments, neurosynaptic core 200 includes axons 101, represented as rows, dendrites 202, represented as columns, synapses 203, represented as row-column junctions, and neurons 204 that receive inputs from dendrites. In some embodiments, there are 256 axons, and 256 neurons. In such embodiments, there are 256×256=65,536 synapses. Information flows from axons 201 to the neurons 204, modulated by the synapses 203. In various embodiments, the synapses may be binary, and may be associated with synaptic weights.

Figure 3:
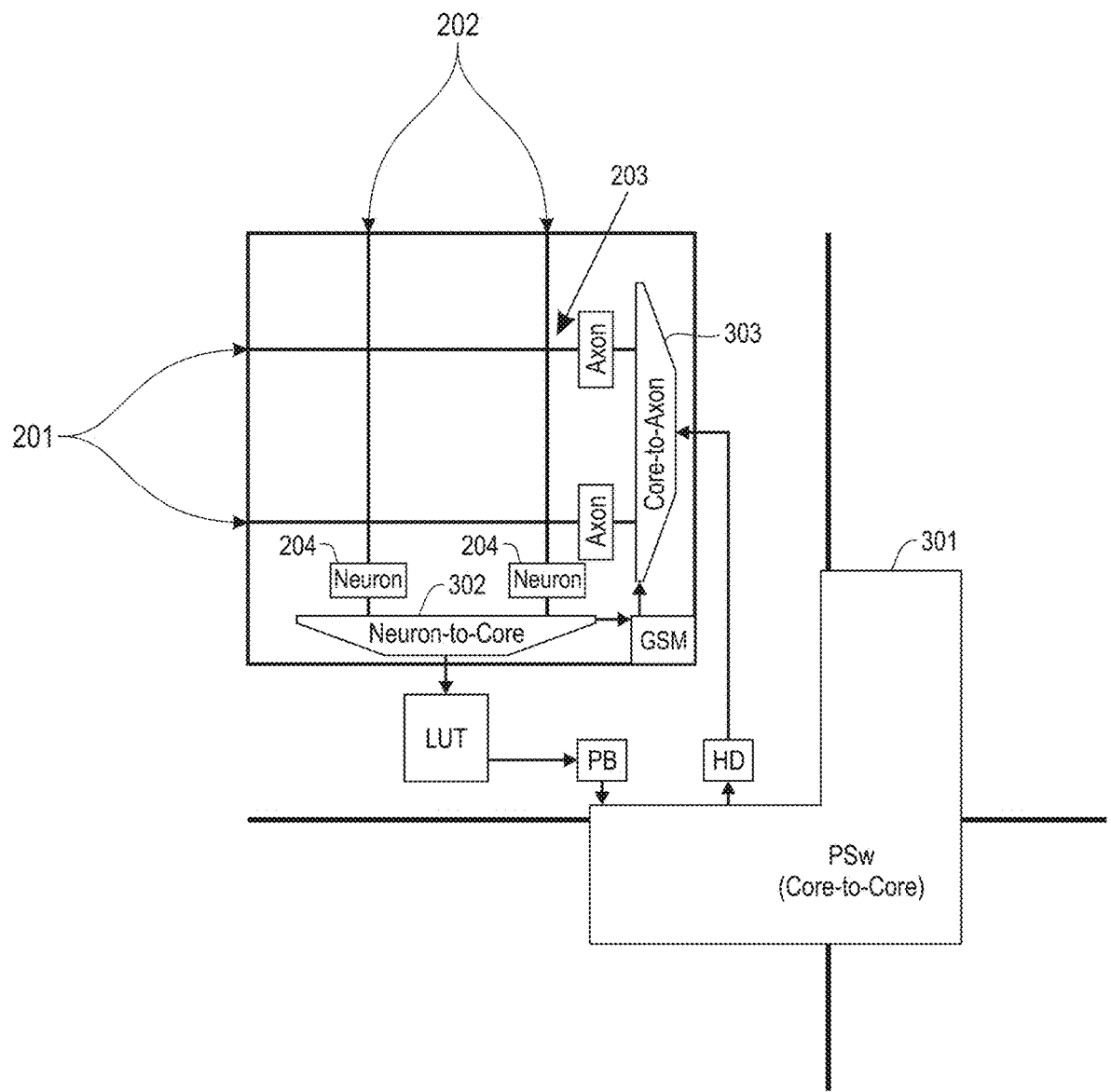
FIG. 3 depicts a neurosynaptic core and mesh router according to embodiments of the present disclosure.

In some embodiments a plurality of neurosynaptic cores are tiled on a chip. In an exemplary embodiment, a 64 by 64 grid of cores is tiled, yielding 4,096 cores, for a total of 1,048,576 neurons and 268,435,456 synapses. In such embodiments, neurons, synapses, and short-distance connectivity are implemented by the core circuit. Long-distance connectivity is logical. An exemplary embodiment is depicted in FIG. 3. Mesh router 301 provides communication between cores. Also on a given core, neuron to core 302 and core to axon 303 communication links are provided.

Figure 4A:
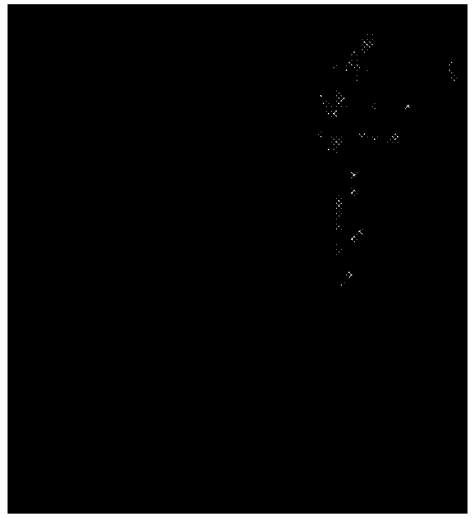
FIGS. 4A-B illustrate exemplary event-based camera output of different window sizes for a stereo setup according to embodiments of the present disclosure.
Figure 4A:
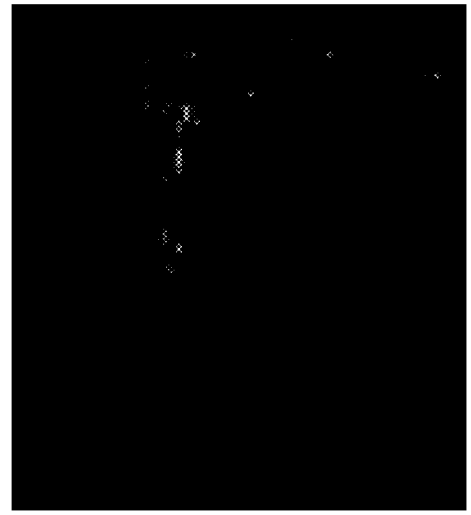
Figure 4A:
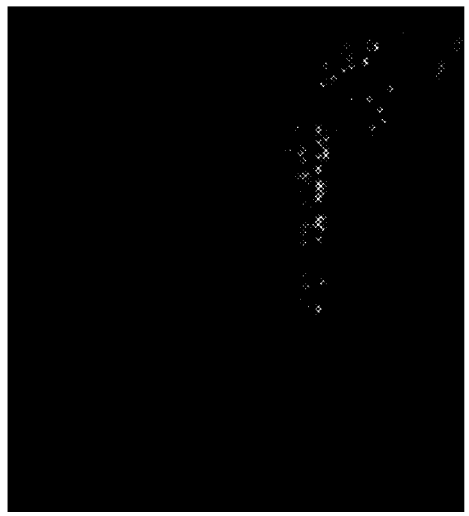
Figure 4A:
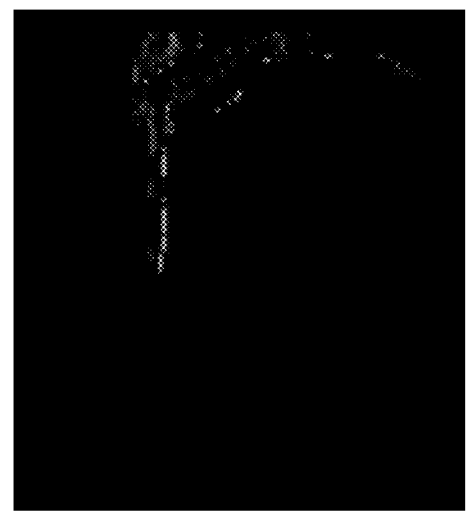
Figure 4B:
Figure 4B:
Figure 4B:
Figure 4B:
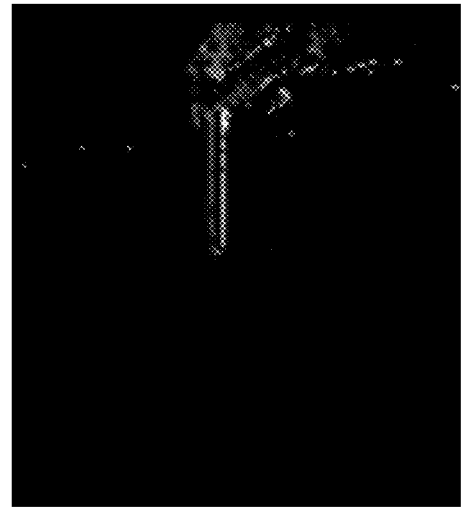

With reference now to FIGS. 4A-B, exemplary event-based camera output of different window sizes are shown for a stereo setup. It will be apparent that the proper window size/time scale to find left-right matches in stereo varies depending on the motion speed. In this example, it will be seen that it is difficult to find dense left-right matches at ~2-4 ms time windows.

Similarly, in other applications using RNNs and DVS systems (gesture recognition, stereo disparity, optic flow, etc.), a ring-buffer routine is useful in order to build systems that perform well. Providing a ring buffering externally, outside the chip, leads to high input spike rates, which degrades system performance. Accordingly, a ring buffer mechanism that can be implemented in spiking networks or networks of neurosynaptic cores is desirable.

One way of implementing a buffer of the recent past is through the use of stochastic neurons (e.g., in a motion history corelet). In such an approach, an input is split across a population of N stochastic neuron sets (representing a set of N windows), with each input arriving at stochastic neuron set i with a delay proportional to i. The population will produce at each tick a representation of the input from N distinct times in the recent past. One limitation of this approach is that stochasticity adds noise which can degrade classification performance. For tasks such as stereo and RNNs a more exact input is desirable, since even a small amount of added noise can degrade system performance.

Another option that does not require stochastic neurons involves the use of delays. For example, to obtain N sliding windows where each window represents the recent memory of M previous ticks, e.g., each window is a BUSor of previous M ticks. This can be implemented by splitting the input NM ways, setting appropriate delays to each split, and BUSor merging appropriate subsets of the data. However, this method leads to the creation of a large number of spikes (NM times more spikes), which can adversely influence run-time performance, especially in multichip systems, as well as adversely affect active power consumption. In addition, the implementation may need windows that are non-periodic/non-deterministic (e.g., controlled by some external control signal).

One approach is to gate the above spikes, but this does not address the issue of the high spike count. If each sliding window is small but with a big period between windows, most of the created spikes are unnecessary/wasteful. As the period P between the windows increases, the number of spikes also increases linearly with P, which is wasteful if we only need to output one window out of every P time instants.

In various embodiments, a low-spike-count ring-buffer mechanism is provided on neuromorphic hardware, which can be used to implement the queue mechanisms described above. In addition, a user-interface is provided that compactly specifies the characteristics of the sliding windows, which encompasses all of the cases described above.

Figure 5:
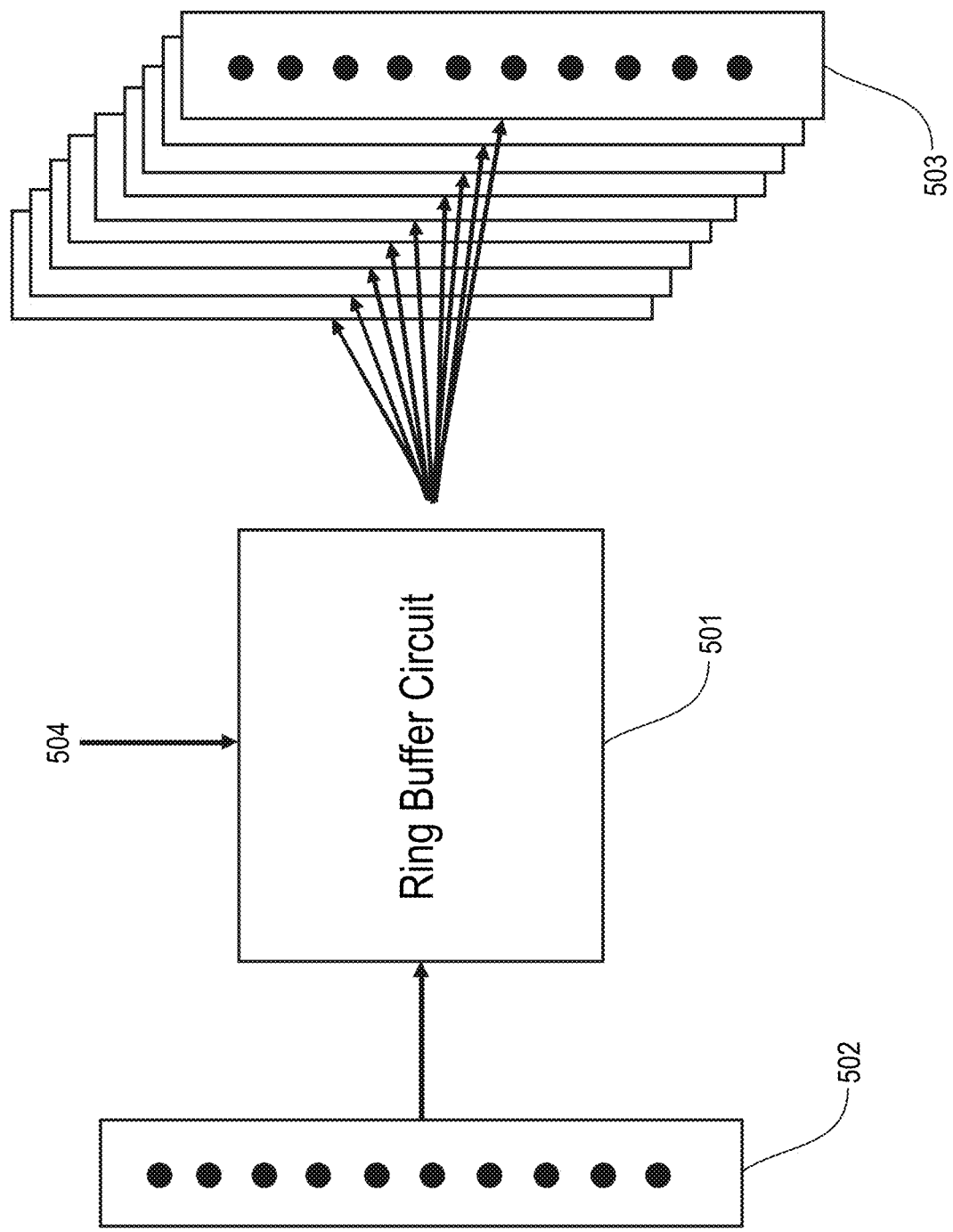
FIG. 5 illustrates an exemplary ring buffer according to embodiments of the present disclosure.

Referring to FIG. 5, an exemplary ring buffer is illustrated according to embodiments of the present disclosure. In various embodiments, a ring buffer corelet is provided. In some embodiments, the corelet instantiation parameters includes some or all of: numInputs, basePeriod, numPeriodsInWindow, phaseWindowStart, numPeriodsBetweenWindows, numWindowsConcatenate.

numInputs corresponds to the number of inputs which may arrive at each tick. For example, this could be equal to the number of pixels in an image.

basePeriod describes the period of the spikes to retain in a window. In other words, each window retains the data from only one of every basePeriod ticks, and the rest are discarded. This encodes the temporal scale of the spike sampling, enabling processing of the input data at multiple temporal scales.

numPeriodsInWindow specifies the time length of the window. A sliding window encompasses basePeriod*numPeriodsInWindow ticks, with numPeriodsInWindow of the spikes in those ticks retained.

phaseWindow Start corresponds to the phase of the first windows' start (tick delay when first window's data written to ring buffer).

numPeriodsBetweenWindows corresponds to the number of periods between windows. For example, if numPeriodsBetweenWindows=1 and basePeriod=1, then at every tick the buffer can output the memory of the events which occurred during the previous numPeriodsInWindow ticks. In other words, the corelet produces output spikes once every numPeriodsBetweenWindows*basePeriod ticks.

numWindowsConcatenate corresponds to the number of windows to concatenate on the output. For example, if set to 2, the memory represented by the 2 previous sliding windows is output.

On TrueNorth, these parameters enable the ring buffer to output a window at 1000 Hz, where every window encodes the spikes from the last 10 ms. This is useful to build a stereo system operating at 1000 Hz with sufficient structure to find left-right correspondences. Alternatively, by setting numPeriodsBetweenWindows=10 and basePeriod=1, only once every 10 ticks would an output window be produced (sparser output, which is also useful in stereo disparity algorithms if finding disparities at 1000 Hz is unnecessary).

Ring buffer circuit 501 receives input from numInputs input pins 502. Ring buffer circuit 501 includes numWindowsConcatenate output connectors 502. Each connector represents a sliding window from a different interval in the recent past. Each sliding window is a representation of the input over some interval specified in the input parameters. No unnecessary spikes are produced inside the ring buffer circuit or by the output connectors.

In some embodiments, an external/non-deterministic/non-periodic probe signal 504 is provided so that non-periodic reads occur.

Referring to FIGS. 6-12, various exemplary runtime configurations of a ring buffer circuit are illustrated. Windows are denoted by boxes. Dots in each window denote the ticks in the window when spikes are sampled. The horizontal axis corresponds to ticks.

Figure 6:
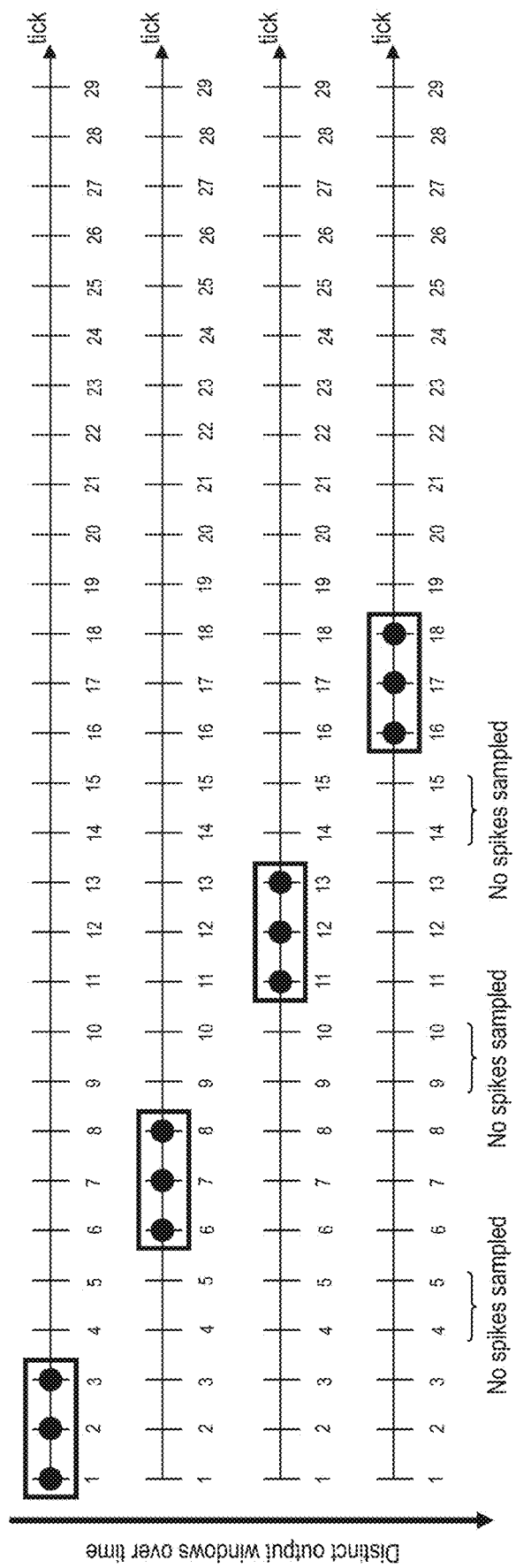
FIGS. 6-12 illustrate various exemplary runtime configurations of a ring buffer circuit according to embodiments of the present disclosure.

In FIG. 6, numInputs=1, basePeriod=1, numPeriodsInWindow=3, phaseWindowStart=0, numPeriodsBetweenWindows=5, and numWindowsConcatenate=1.

Figure 7:
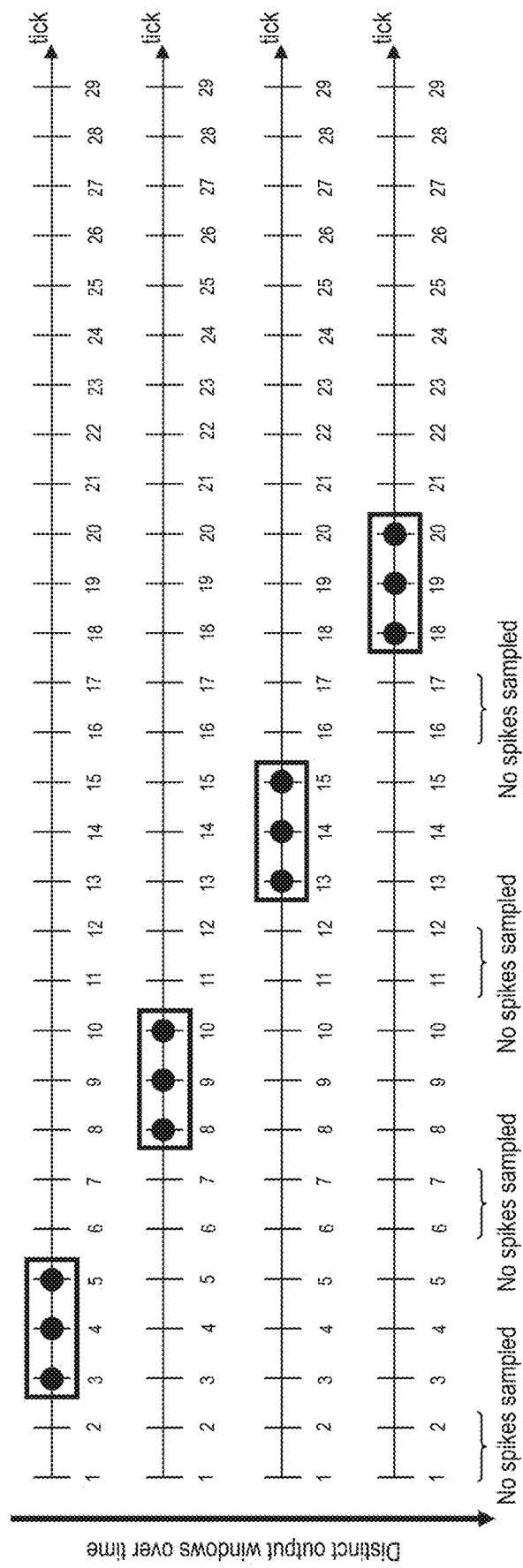

In FIG. 7, numInputs=1, basePeriod=1, numPeriodsInWindow=3, phaseWindowStart=2, numPeriodsBetweenWindows=5, and numWindowsConcatenate=1.

Figure 8:
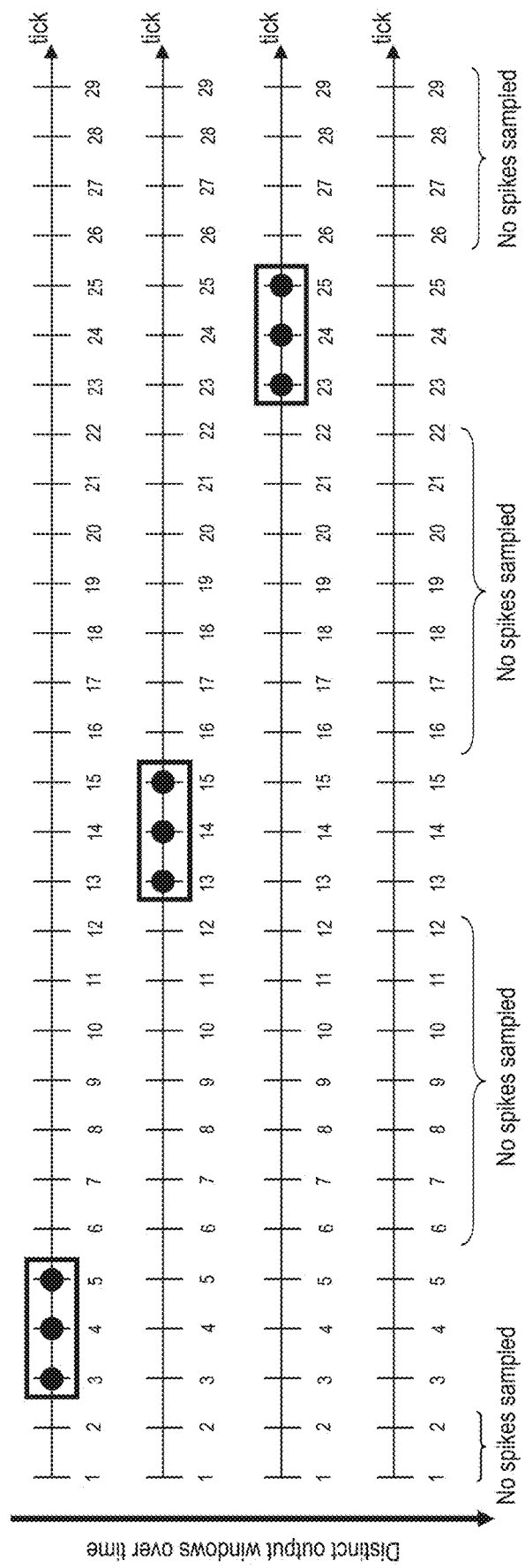

In FIG. 8, numInputs=1, basePeriod=1, numPeriodsInWindow=3, phaseWindowStart=2, numPeriodsBetweenWindows=10, and numWindowsConcatenate=1.

Figure 9:
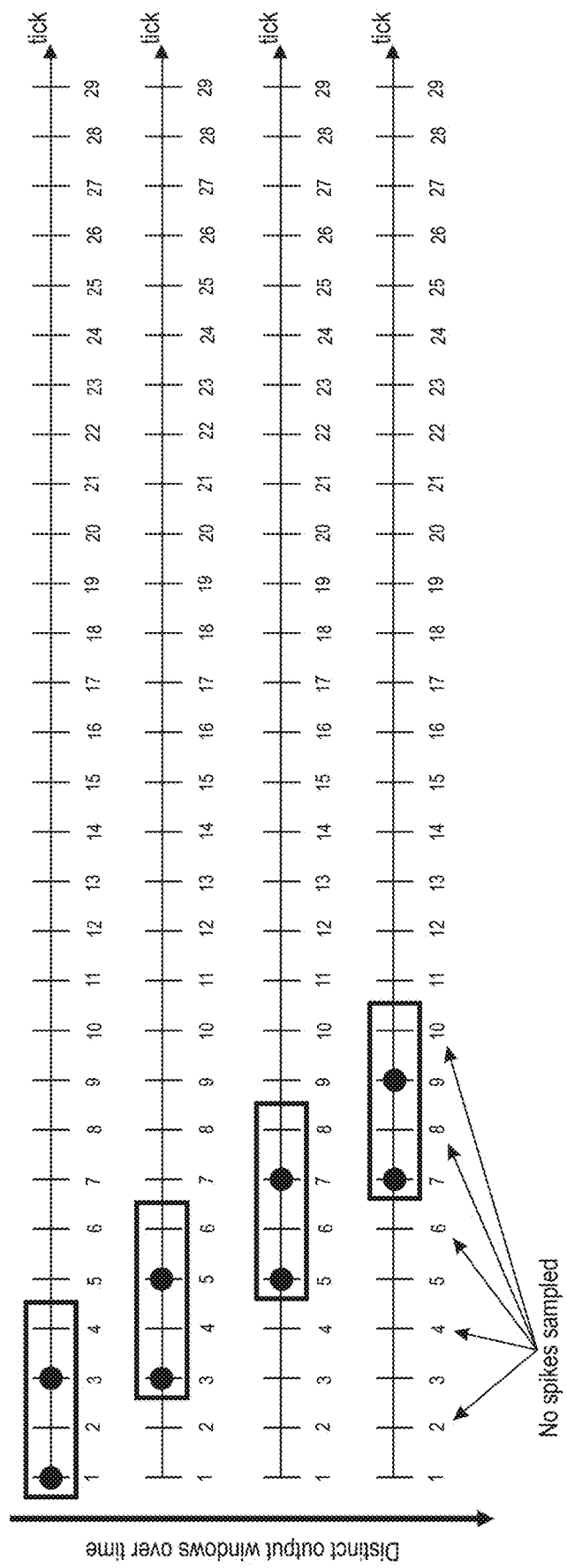

In FIG. 9, numInputs=1, basePeriod=2, numPeriodsInWindow=2, phaseWindowStart=0, numPeriodsBetweenWindows=1, and numWindowsConcatenate=1.

Figure 10:
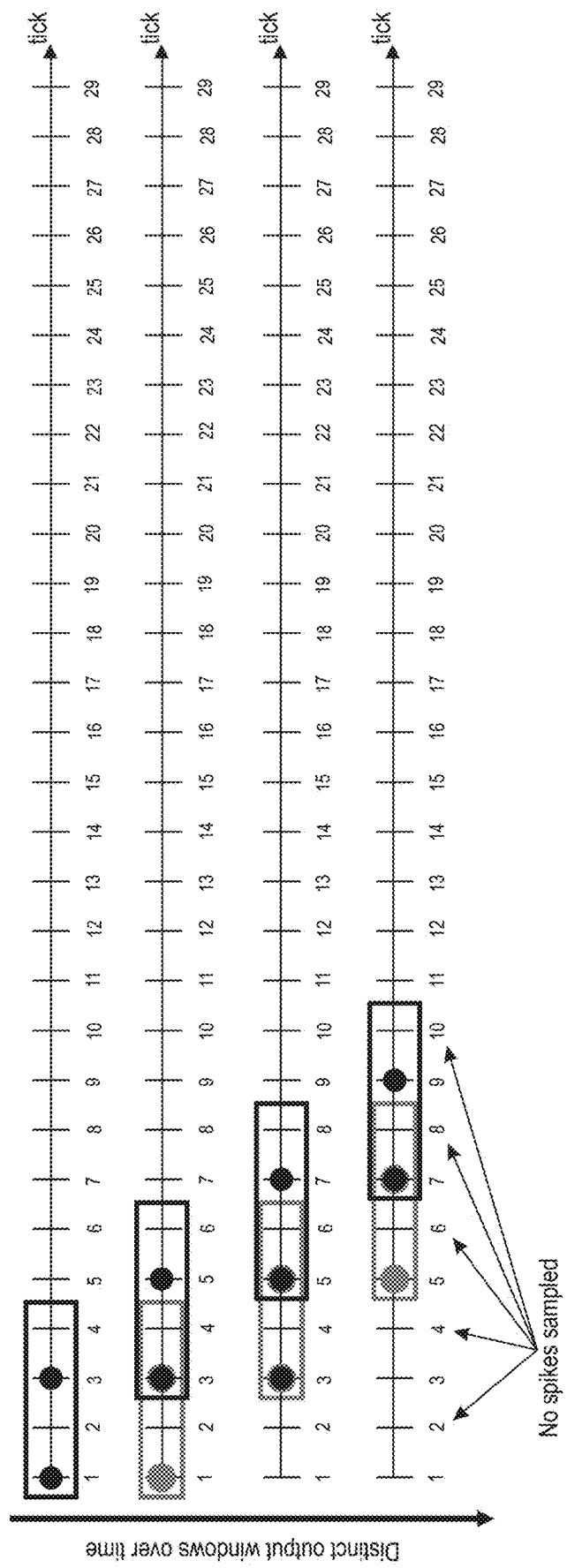

In FIG. 10, numInputs=1, basePeriod=2, numPeriodsInWindow=2, phaseWindowStart=0, numPeriodsBetweenWindows=1, and numWindowsConcatenate=2.

Figure 11:
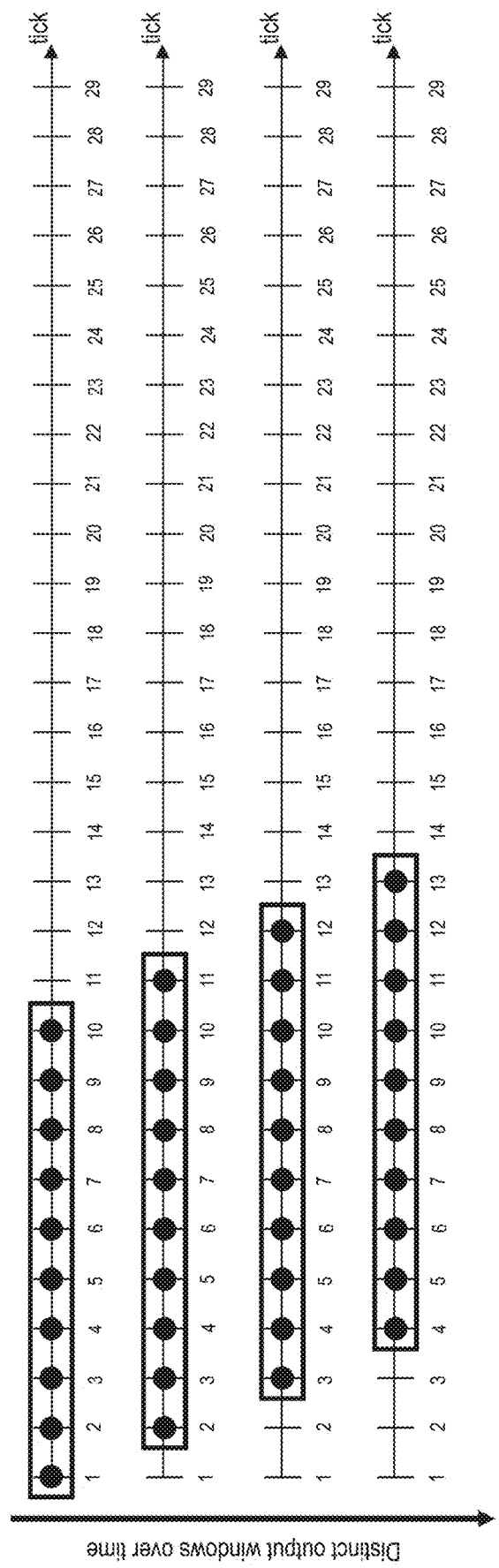

In FIG. 11, numInputs=1, basePeriod=1, numPeriodsInWindow=10, phaseWindowStart=0, numPeriodsBetweenWindows=1, and numWindowsConcatenate=1.

Figure 12:
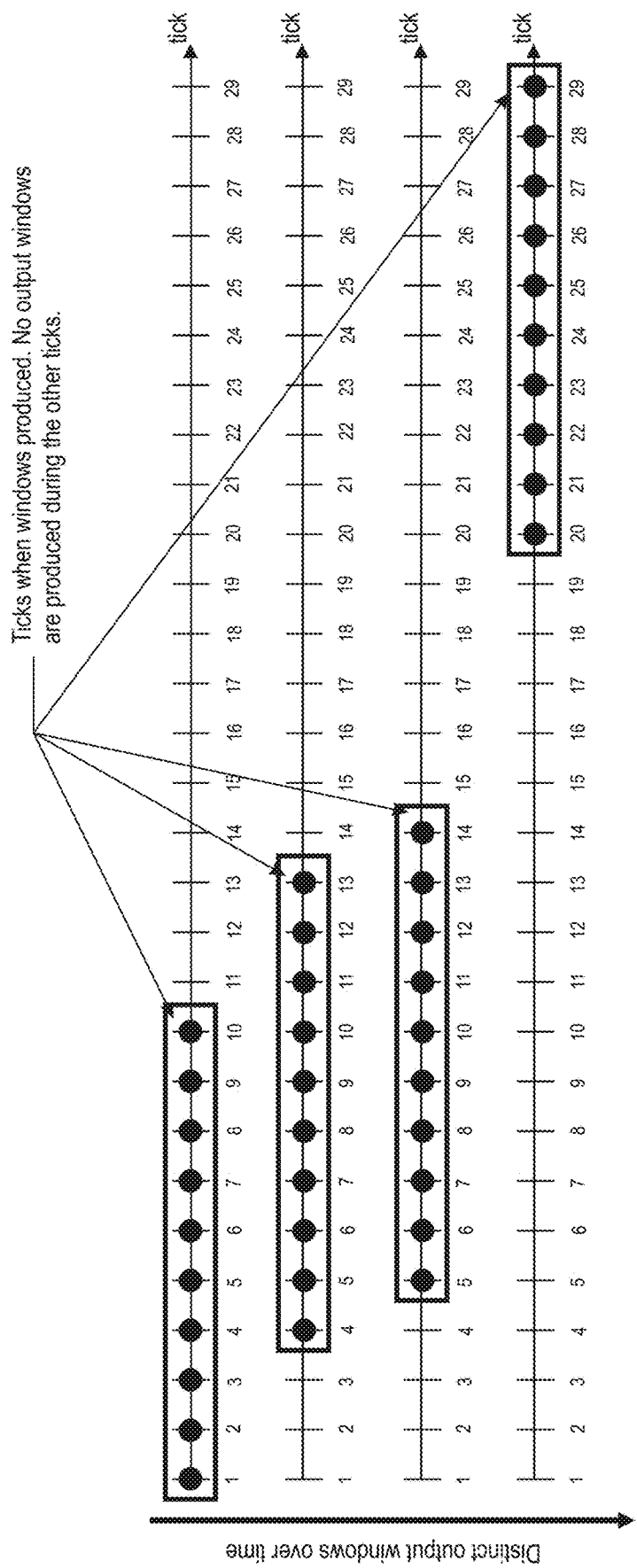

In FIG. 12, numInputs=1, basePeriod=1, numPeriodsInWindow=10, phaseWindowStart=0, numPeriodsBetweenWindows=<nonperiodic/non-deterministic/external control>, numWindowsConcatenate=1. In this example, nonperiodic output is provided.

Figure 13:
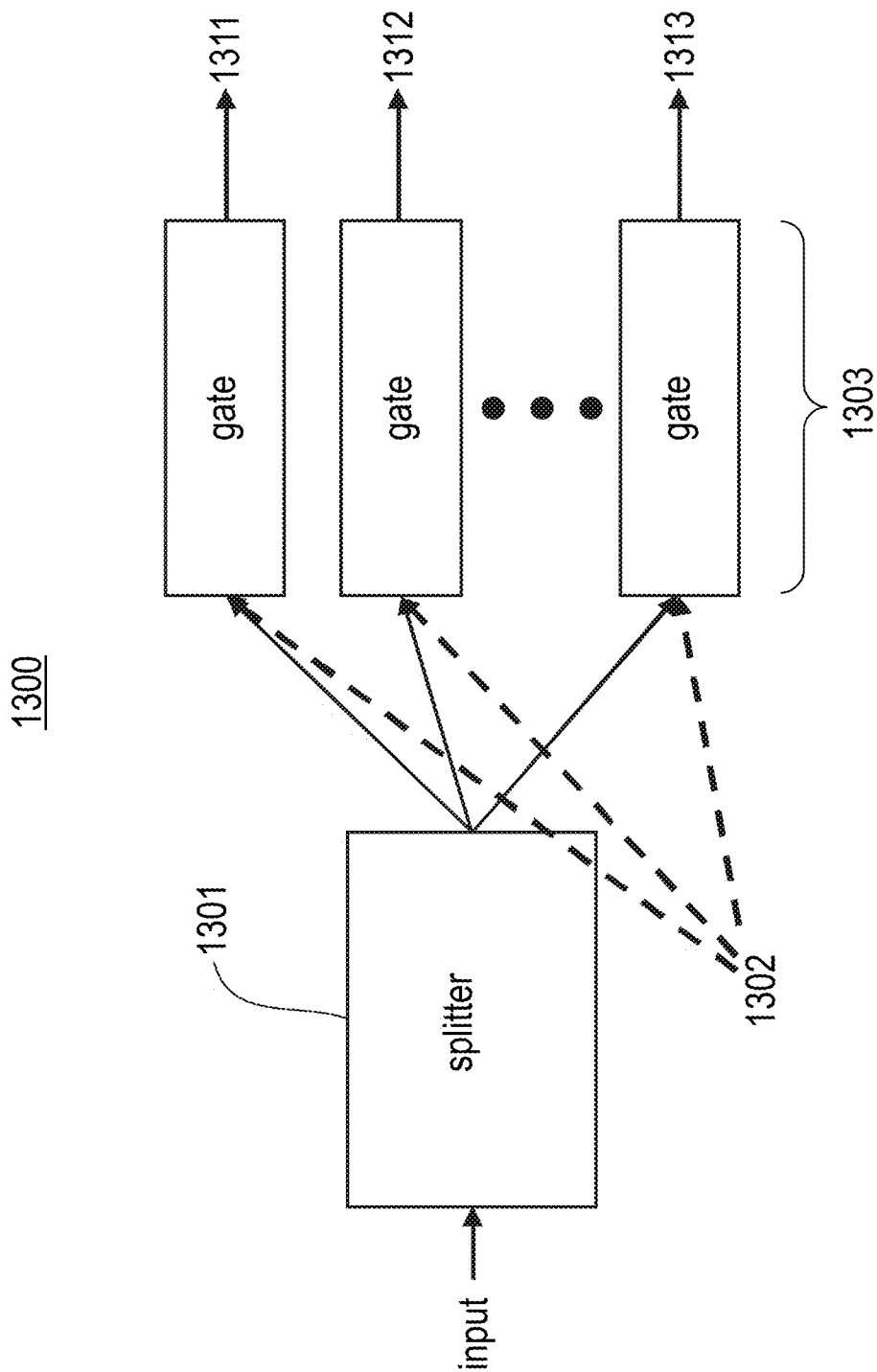
FIG. 13 illustrates an exemplary ring buffer neural circuit implementation according to embodiments of the present disclosure.

Referring to FIG. 13, an exemplary ring buffer neural circuit implementation is illustrated according to embodiments of the present disclosure. In this example, numPeriodInWindow=1 with periodic sampling. In this case, a simple splitter 1301 and/or time division demultiplexer suffices to implement all possible functions regardless of the other parameter values. This is the simplest set of input parameters.

Control pulses 1302 are provided to determine which of gates 1303 is open at each tick. Pulses may be external or generated by periodically spiking neurons. For ease of exposition the splitter 1301 and gates 1303 are shown as distinct units, but in practice they may be merged into a single neuron per output pin. numWindowsConcatenate output connectors 1311 . . . 1313 are provided.

Referring to FIGS. 14A-F, an exemplary ring buffer neural circuit implementation is illustrated according to embodiments of the preset disclosure. In this example, numPeriodsInWindow>1. Accordingly, a ring buffer of memory cells 1401 is used. In various embodiments, the memory cells 1401 are implemented as described in U.S. Pub. No. 2017/0116513, which is hereby incorporated by reference in its entirety. numPeriodsInWindow+2 memory cells are created. This example corresponds to numPeriodsInWindow=6.

Spike data 1402 are provided on a per tick basis to time-division demultiplexor 1403, which in some embodiments corresponds to circuit 1300 of FIG. 13. The demultiplexer 1403 writes 1410 its output every basePeriod ticks to the next adjacent memory cell in the ring buffer. The solid line denotes the memory cell being written to at each tick. In particular, FIGS. 14A-D form a temporal sequence of ticks: 1; 1+basePeriod; 1+2*basePeriod; and 1+3*basePeriod, respectively.

Figure 14A:
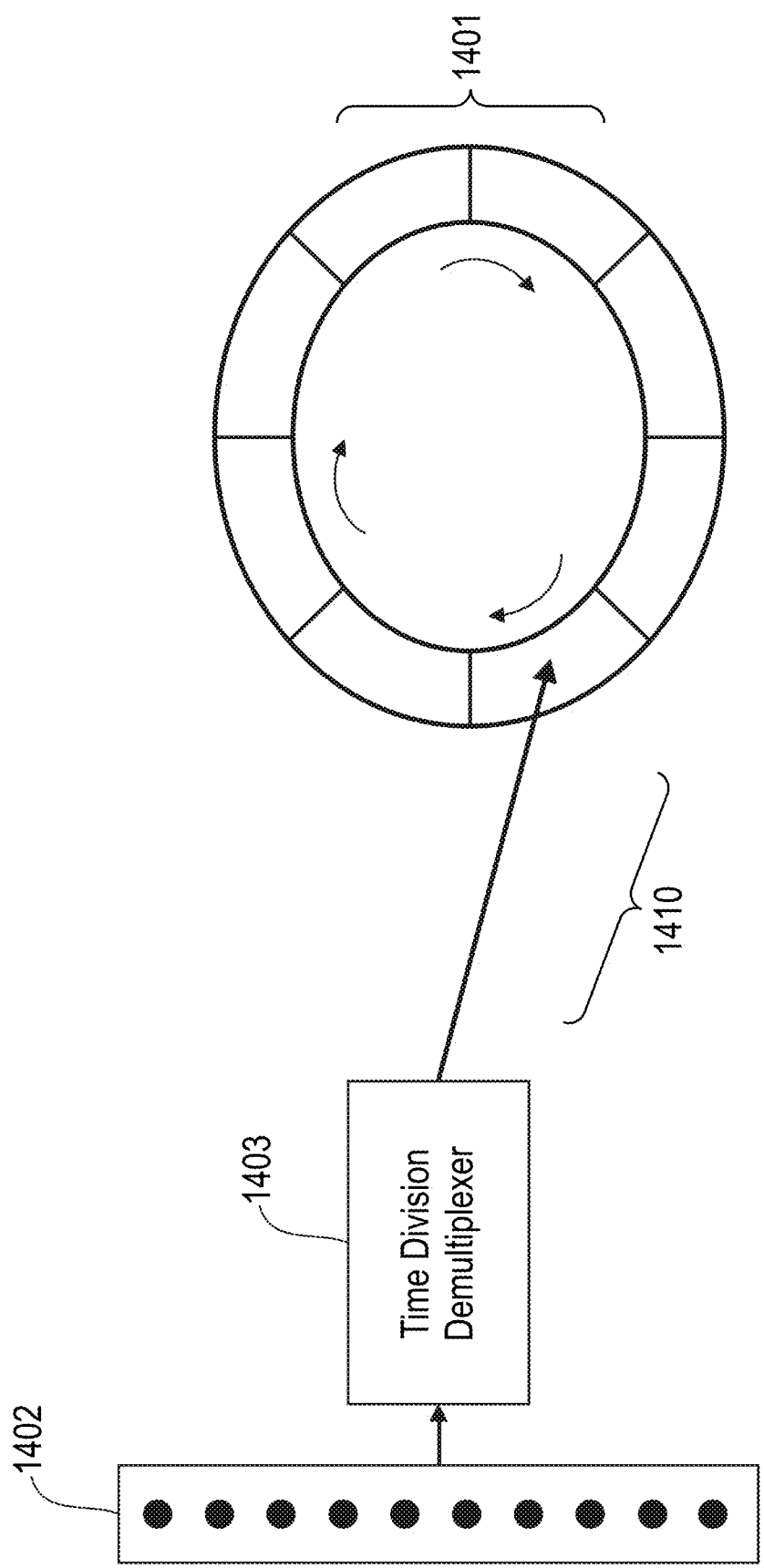
FIGS. 14A-F illustrate an exemplary ring buffer neural circuit implementation according to embodiments of the present disclosure.
Figure 14B:
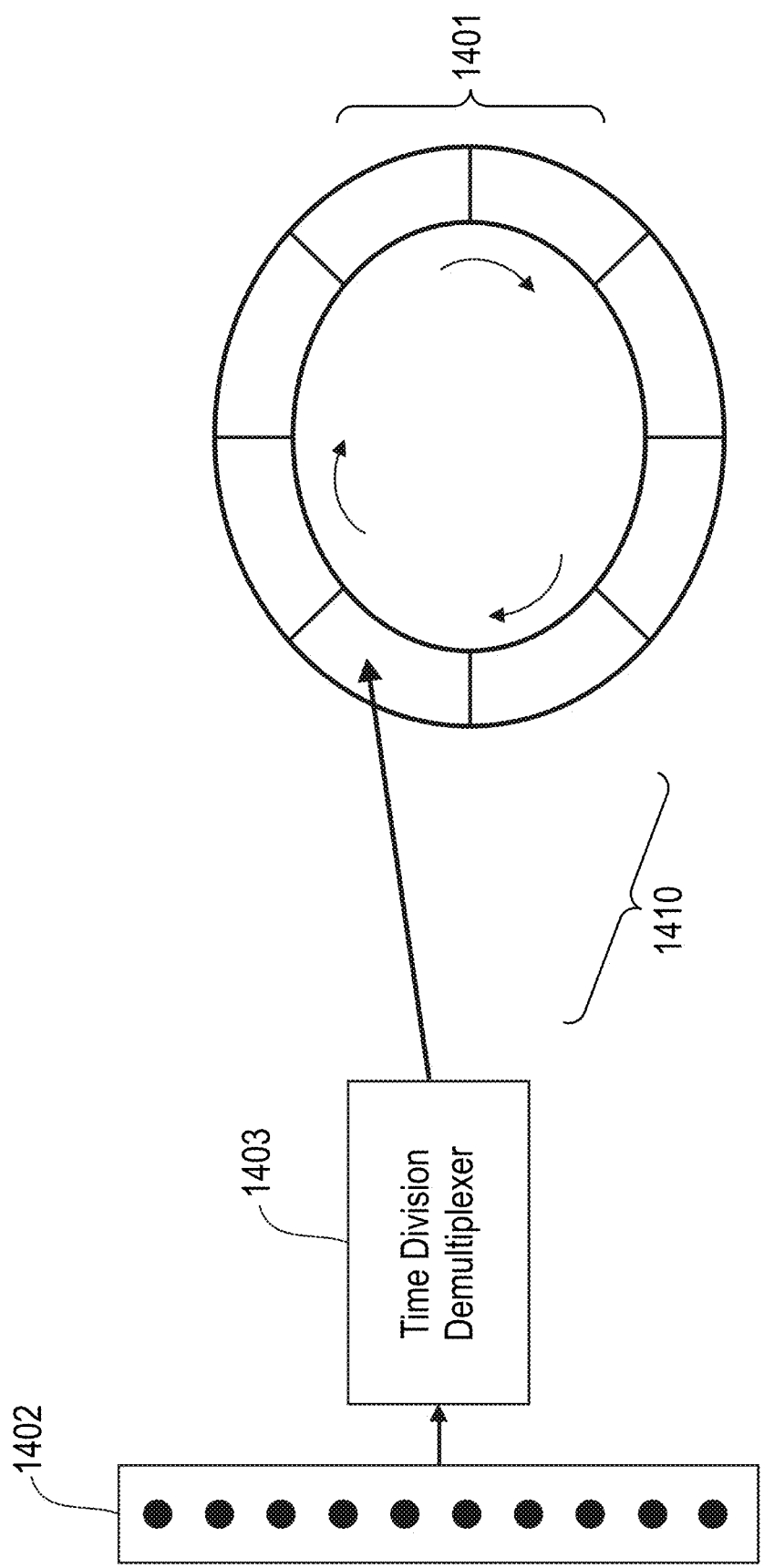
Figure 14C:
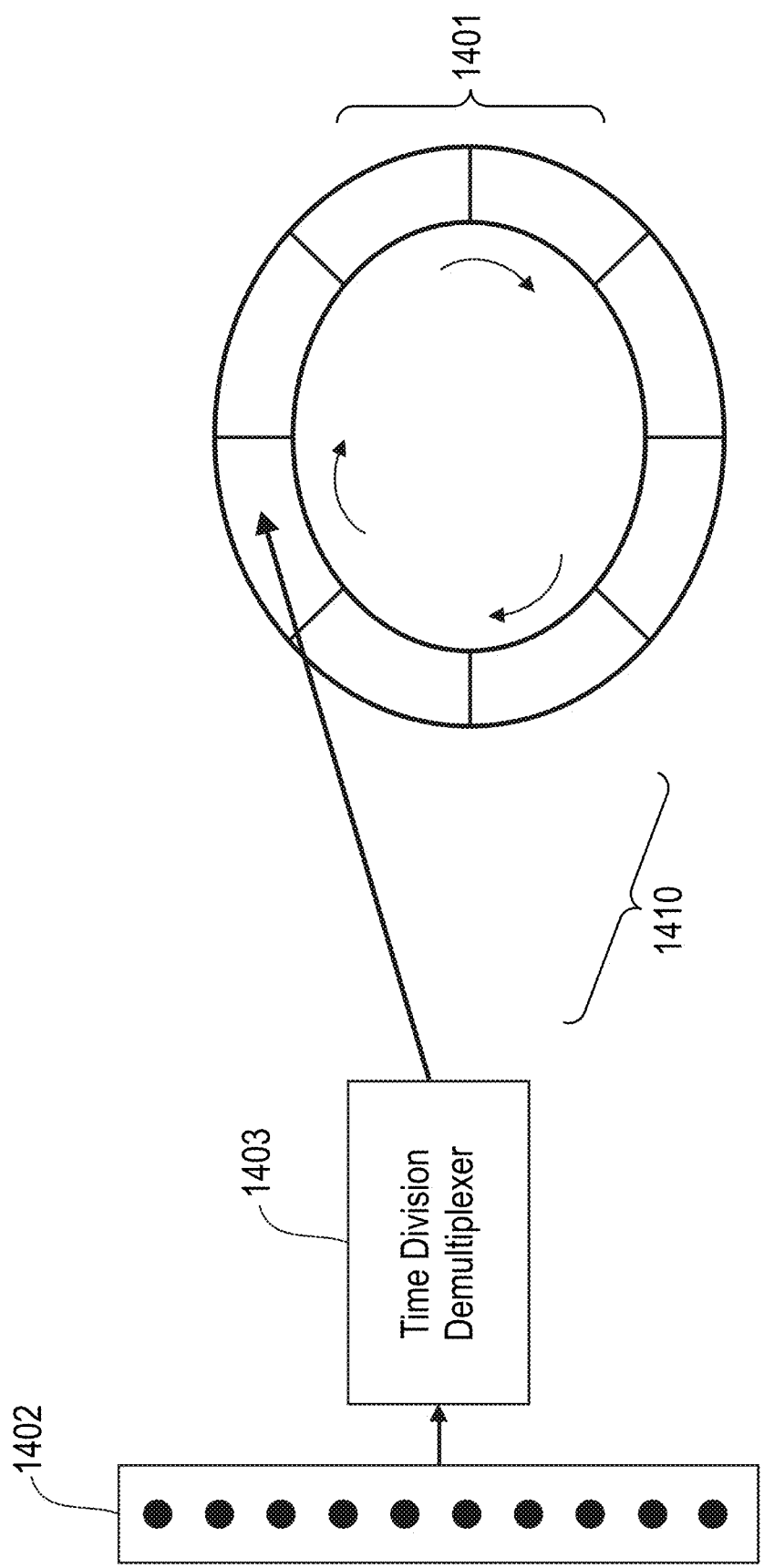
Figure 14D:
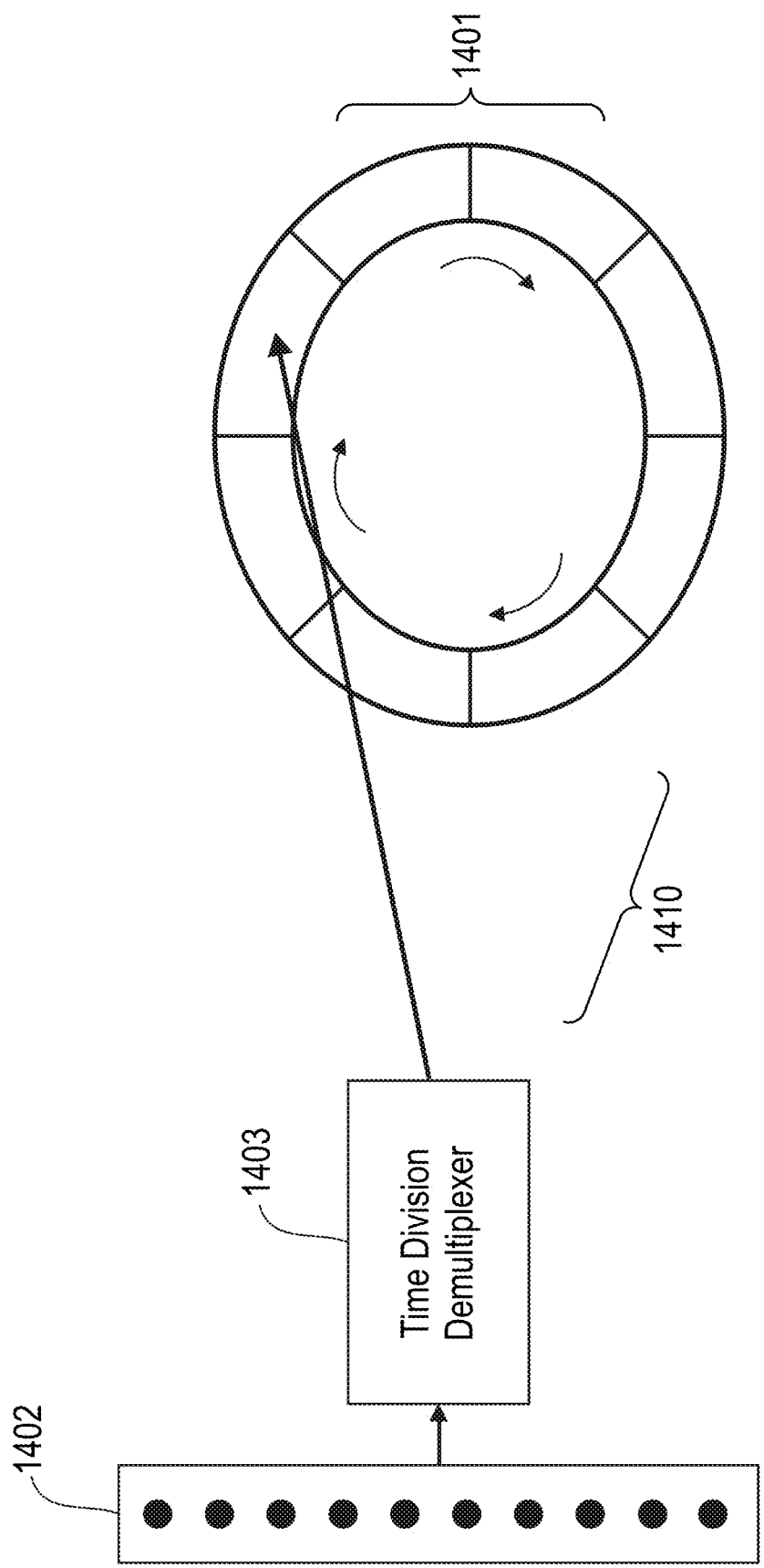
Figure 14E:
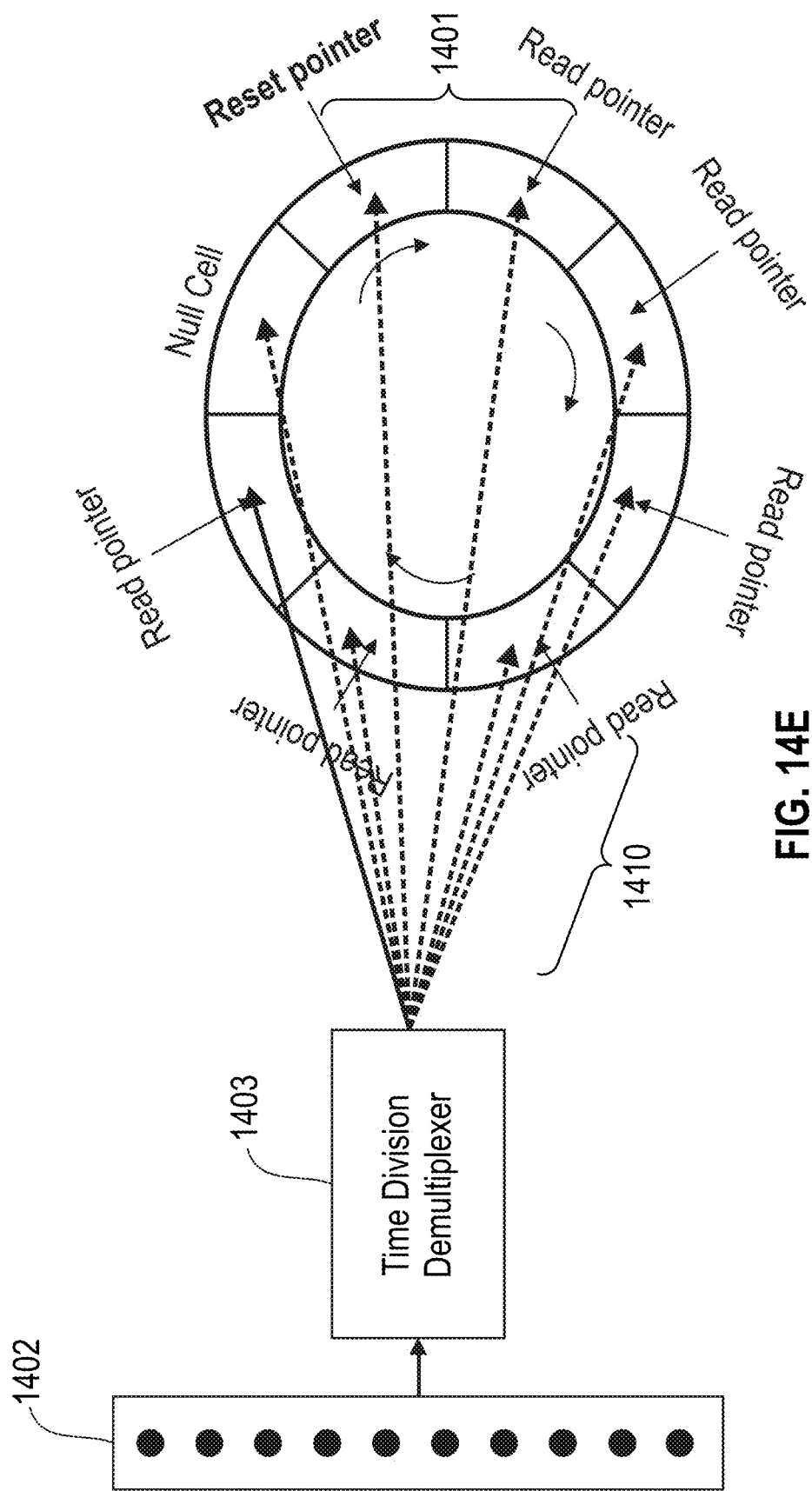

At each tick up to numPeriodsInWindow, cells can be simultaneously queried or read. This is illustrated in FIG. 14E, where the cell being written to is also read at the same instant. Two cells ahead of the front of the queue, a reset takes place to empty the cell, since it takes two ticks for a memory cell to be reset. As a result, the cell in front of the current front of the queue is neither written to, or read or reset, as shown in the diagram. The null cell is not necessary if basePeriod>1.

Figure 14F:
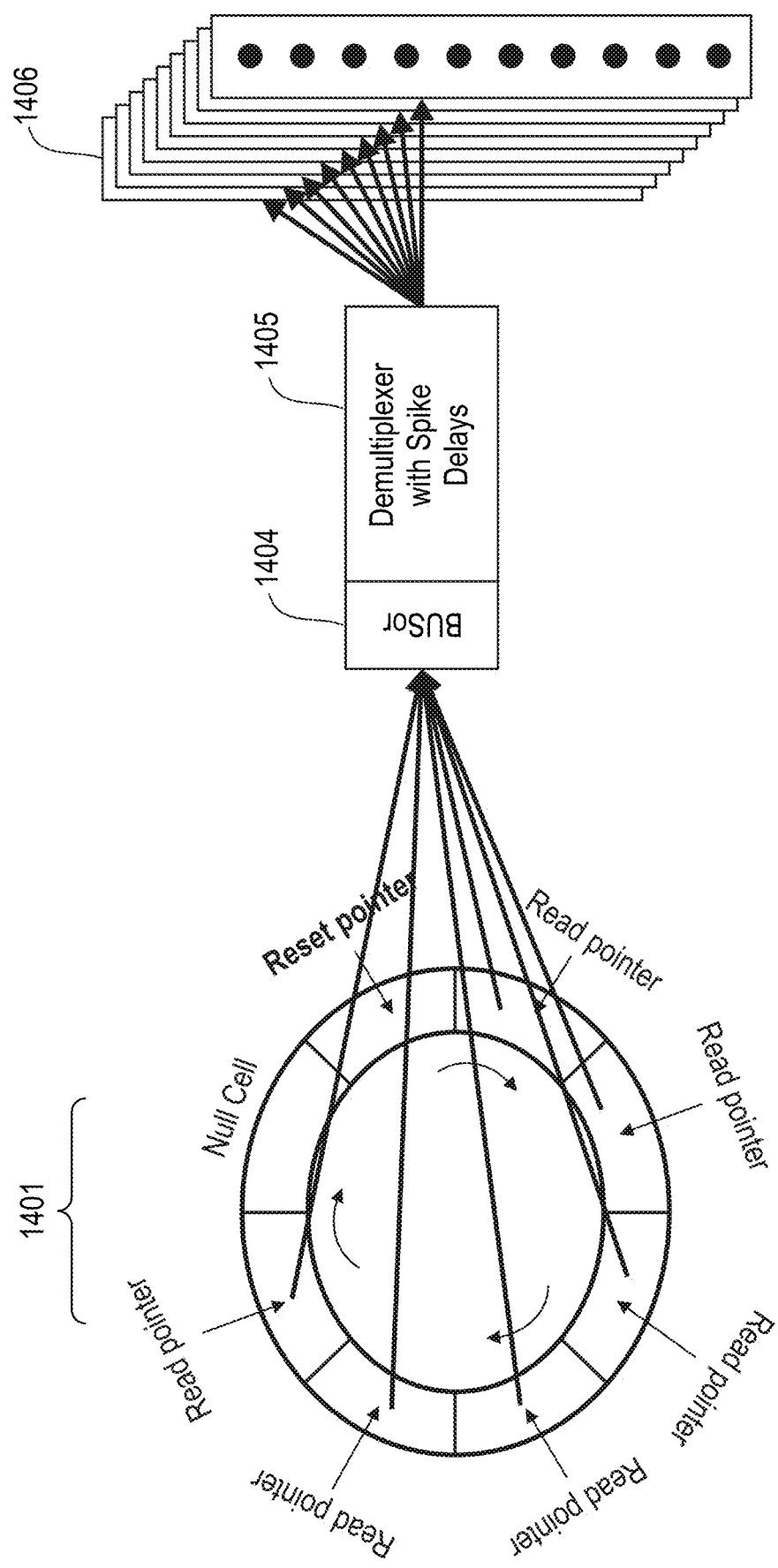

FIG. 14F illustrates reading from buffer. The contents of each cell being read are provided to BUSor 1404. The combined output is provided to demultiplexer 1405, which in some embodiments applies spike delays. Output is provided through numWindowsConcatenate output connectors 1406.

Figure 15:
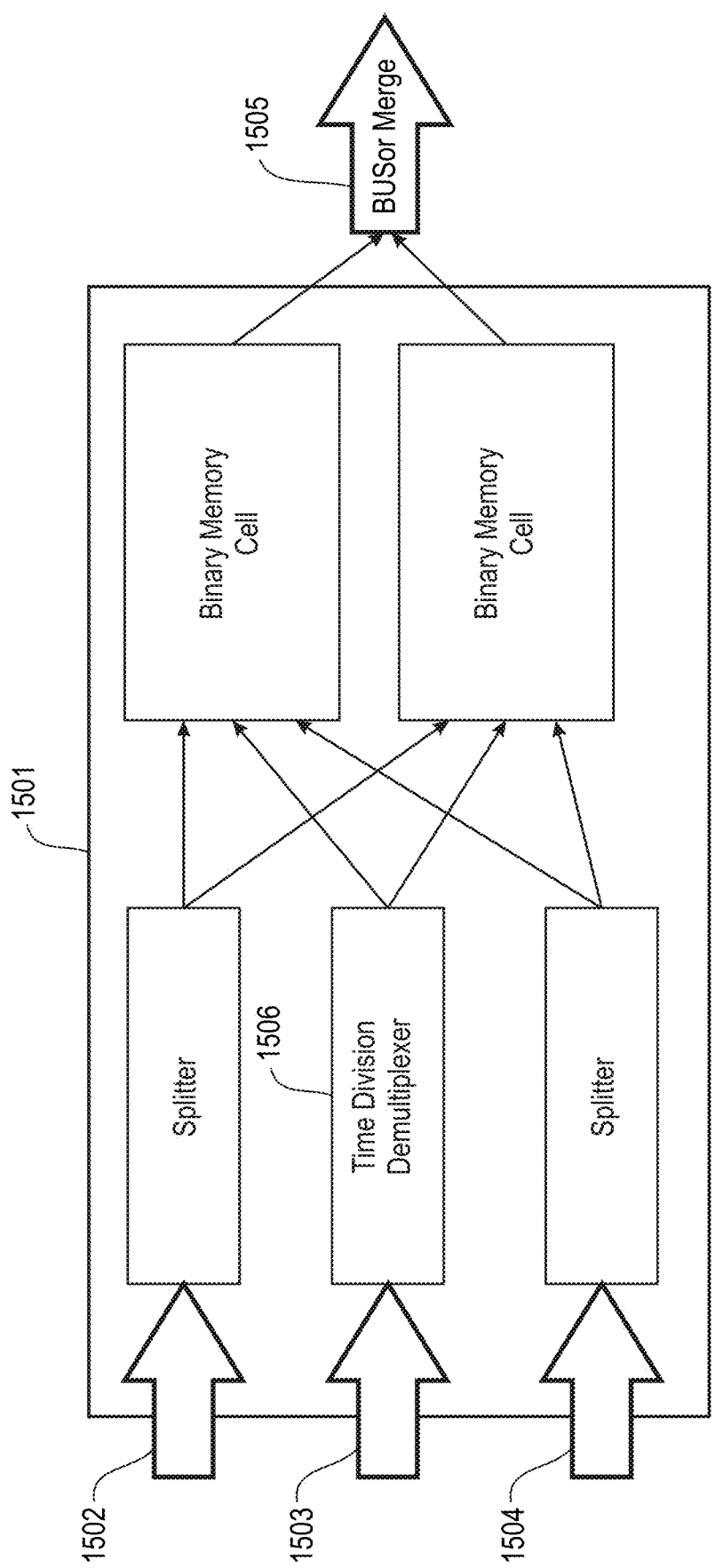
FIG. 15 illustrates an exemplary memory cell implementation of a ring buffer according to embodiments of the present disclosure.

Referring now to FIG. 15, an exemplary memory cell implementation of a ring buffer is illustrated according to embodiments of the present disclosure. Memory cell corelet 1501 includes an input axon 1502, a probe axon 1503, a reset axon 1504, and an output 1505. Input axon 1502 receives new input to store in the memory cell, setting the memory to the desired value. A spike along the memory probe control axon 1503 results in releasing the memory contents. Probe spikes can enter at every tick, so the memory cell can be queried at up to 1000 Hz on TrueNorth. A spike along the reset axon 1504 sets the memory cell to empty in preparation for the next input. In an exemplary TrueNorth implementation, a binary memory cell can be probed at most once every two ticks. Demultiplexer 1506 ensures the ability to probe the memory cells at 1000 Hz.

Figure 16:
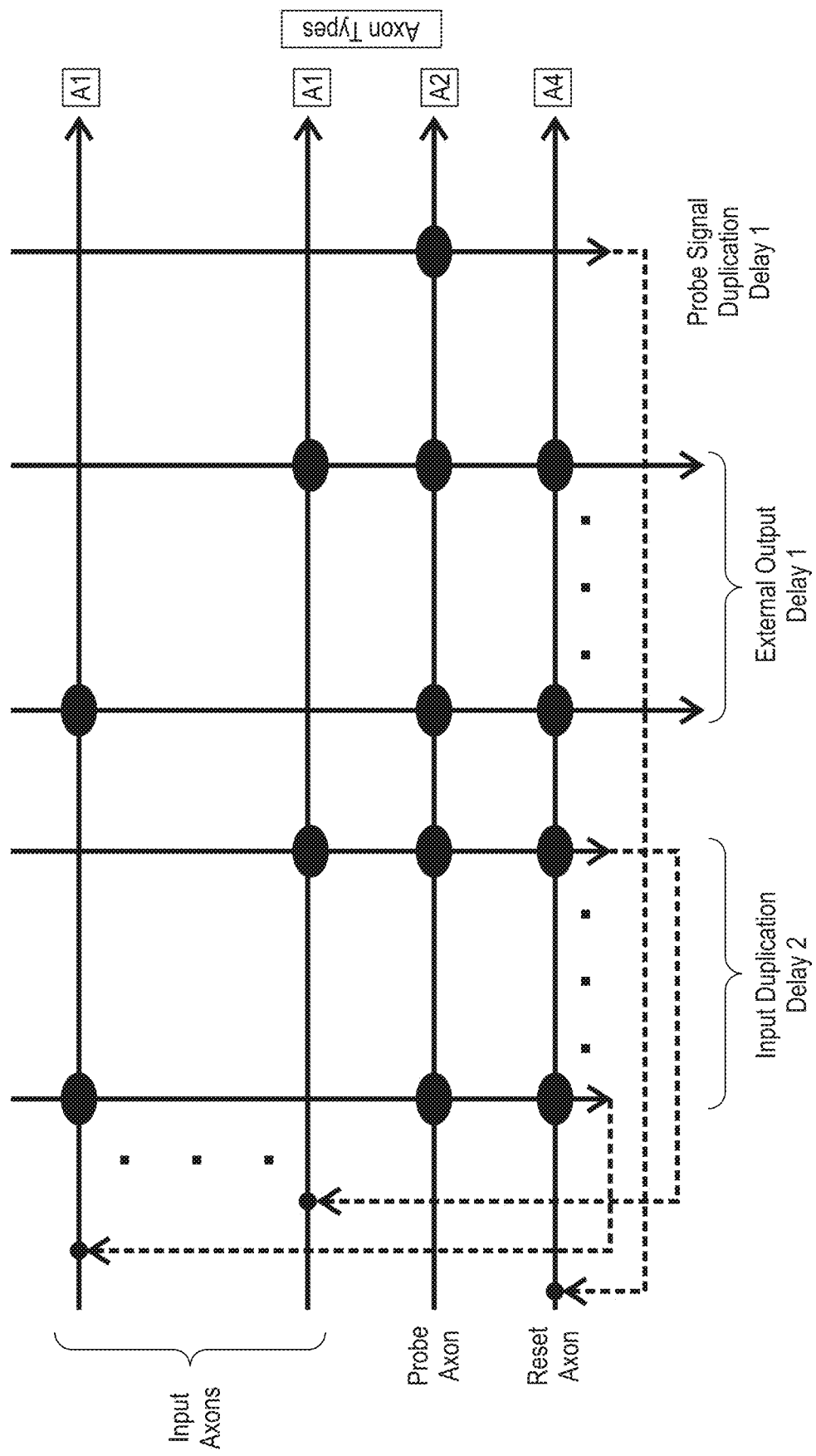
FIG. 16 illustrates an exemplary memory cell implementation according to embodiments of the present disclosure.

Referring to FIG. 16, an exemplary memory cell implementation is illustrated according to embodiments of the present disclosure. In particular, this memory cell is described in U.S. Pub. No. 2017/0116513, which is hereby incorporated by reference it its entirety.

In various embodiments, the ring buffer is implemented by storing events in membrane potentials of memory cell neurons in a circular buffer, and through the use of control neurons that spike periodically to polarize appropriate memory cell neurons. Buffers can encode the input at various temporal scales. For example at a scale T=5 the buffer denotes if an event occurred at the corresponding pixel during the last 5 ticks (logical disjunction).

A control neuron that produces events with period T and phase $\phi$ is defined by a neuron $a_T(V_\phi^{ctrl})$ that satisfies $$\frac{\partial V_\phi^{ctrl}(t)}{\partial t} = 1,$$

$V_\phi^{ctrl}(0)=\phi$ and resets to zero upon producing an event ($a_T(V(t))$ is an activation function equal to 1 if the membrane potential at time t—V(t)—is at least equal to T and is equal to 0 otherwise). Through populations of such neurons one can also define $a_T(V_{[\phi,\theta]}^{ctrl})$ corresponding to phase intervals $[\phi, \theta]$ (where $\theta - \phi + 1 \leq T$), defining periodic intervals of events. Such control neurons are used to probe (prb) or reset (rst) neuron membrane potentials. A memory cell neuron is a recurrent neuron which accepts as input either its own output (so that it does not lose its stored value whenever the neuron is queried for its stored value), input axons to set the neuron value and control axons for resetting and querying the memory cell. In more detail the output at index $r \in \{0, \ldots, T+1\}$ of a T+2 size memory cell ring-buffer at a given pixel p, is multiplexed via two copies ($m \in \{0,1\}$) and is defined as $a_2(V_{p,m,r}^{mem})$ where:

$$\frac{\partial V_{p,m,r}^{mem}(t+1)}{\partial t} = \left[-a_{T+2}(V_{\hat{s}+1}^{rst}(t)) + \right.$$
$$\left([a_1(V_p^{spl}(t))]_{\hat{r}}^r \vee [a_2(V_{p,m,r}^{mem}(t-1))]_{\hat{t}}^m\right) +$$
$$\left.[a_{T+2}(V_{[3-r,T+2-\hat{r}]}^{prb}(t))]_{\hat{t}}^m - [a_{T+2}(V_{[2-r,T+1-\hat{r}]}^{rst}(t))]_{\hat{t}}^{1-m}\right]_+$$

Equation 1

In Equation 1, probe/reset (prb/rst) control neurons are used, $\hat{r}=t \mod(T+2)$, $\hat{s}=T+2-r \mod(T+2)$, $\hat{t}=t \mod(2)$, $\vee$ is logical disjunction, $a_1(V_p^{spl})$ denotes a splitter neuron at pixel p (providing a copy of the data/spikes at pixel p before entering the ring buffer), and:

$$[x]_r^r = \begin{cases} \max\{0, x\}, & \text{if } r = \hat{r} \\ 0, & \text{otherwise} \end{cases}$$

Equation 2

In Equation 2, $[x]_+ \stackrel{\text{def}}{=} [x]_1^1$ defines a ReLU function.

In various embodiments, disjunction is implemented by sending input events to the same neuron input axon, effectively merging any input events to a single input event.

Equation 2 defines a ring-buffer with T+2 memory cells, where probe pulses periodically and uniformly query T of the T+2 cells for the stored memory contents at each tick, where m=0 neurons are probed at odd ticks and m=1 neurons are probed at even ticks. Reset pulses control when to reset one of the T+2 memory cells to zero in preparation of a new input.

New inputs $(a_1(V_p^{spl}(\bullet)))$ are always routed to the cell r that was reset in the previous tick. The probe pulses result in the creation of an output event if during the last T ticks $a_1(V_p^{spl}(\bullet))$ produced an event. After a probe event, a reset event decrements the previous +1 membrane potential increase, followed by the restoring of the memory event output during the last probe $(a_2(V_{p,m,r}^{mem}(t-1)))$.

Figure 17:
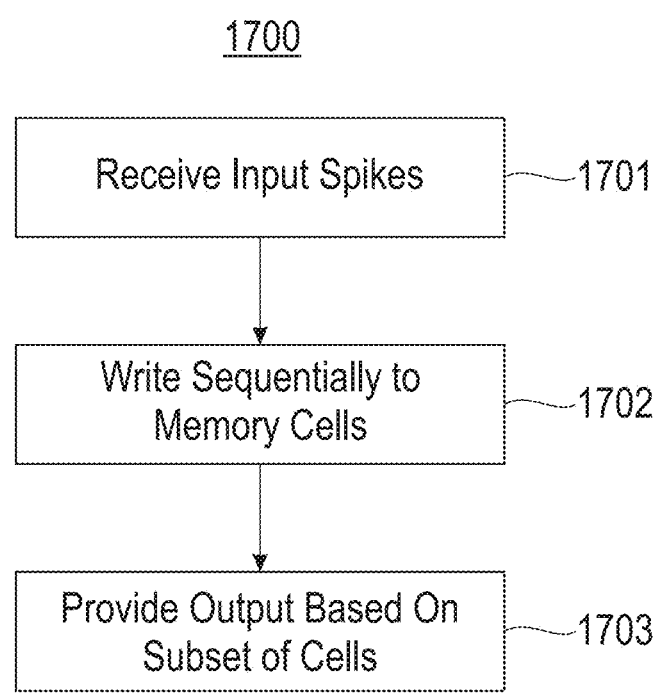
FIG. 17 illustrates a method of buffering according to embodiments of the present disclosure.

Referring to FIG. 17, a method of buffering on neurosynaptic hardware is illustrated according to embodiments of the present disclosure. At 1701, input comprising a plurality of spikes is received at a demultiplexer. At 1702, the demultiplexer writes sequentially to each of a plurality of memory cells of a ring buffer. The plurality of memory cells comprises one or more neurosynaptic core. At 1703, an output is provided based on contents of a subset of the plurality of memory cells at a plurality of output connectors.

As set out above, in various embodiments, a low spike count ring buffer system is executed on neuromorphic/spiking hardware where the user interface enables the user to specify an arbitrary window size (buffer size). Neuromorphic hardware may include networks of neurosynaptic cores. The user interface may enable the user to specify the basePeriod, denoting the temporal scale of the data sampling (every how many ticks do we retain input data). The user interface may enable the user to specify a numPeriodsBetweenWindows variable specifying how often an output window should be produced/sampled. The user interface may enable the user to specify a number numWindowsConcatenate denoting how many of the previous windows the circuit should output simultaneously every numPeriodsBetweenWindows*basePeriod ticks. The user interface may enable the user to specify a numInputs variable denoting the input size. The user interface may enable the user to specify a phaseWindowStart number specifying the tick number when the first window's data is written to ring buffer, effectively controlling the phase of the output windows produced.

In some embodiments, the corelet can also take an external read/probe signal so that the ring buffer is not necessarily queried periodically, but whenever an external read/probe control signal arrives.

In some embodiments, the ring buffer is used to process/buffer/consume data produced by a spiking/retinal camera. In some embodiments, the ring buffer is used in a stereo disparity algorithm executed/implemented on neuromorphic hardware.

It will be appreciated that the present disclosure is suitable for implementing a LIFO or a FIFO buffer on neuromorphic hardware.

It will be appreciated that the present disclosure is suitable for providing multiscale temporal processing on neuromorphic multi-core systems (e.g., processing data along multiple temporal dimensions) using a ring-buffer mechanism implemented on networks of neurosynaptic cores. In some embodiments, multiscale spatial processing is provided (multiscale processing along both spatial and time dimensions) using a ring-buffer mechanism implemented on networks of neurosynaptic cores. In some embodiments, the input is spike/event-based data.

Figure 18:
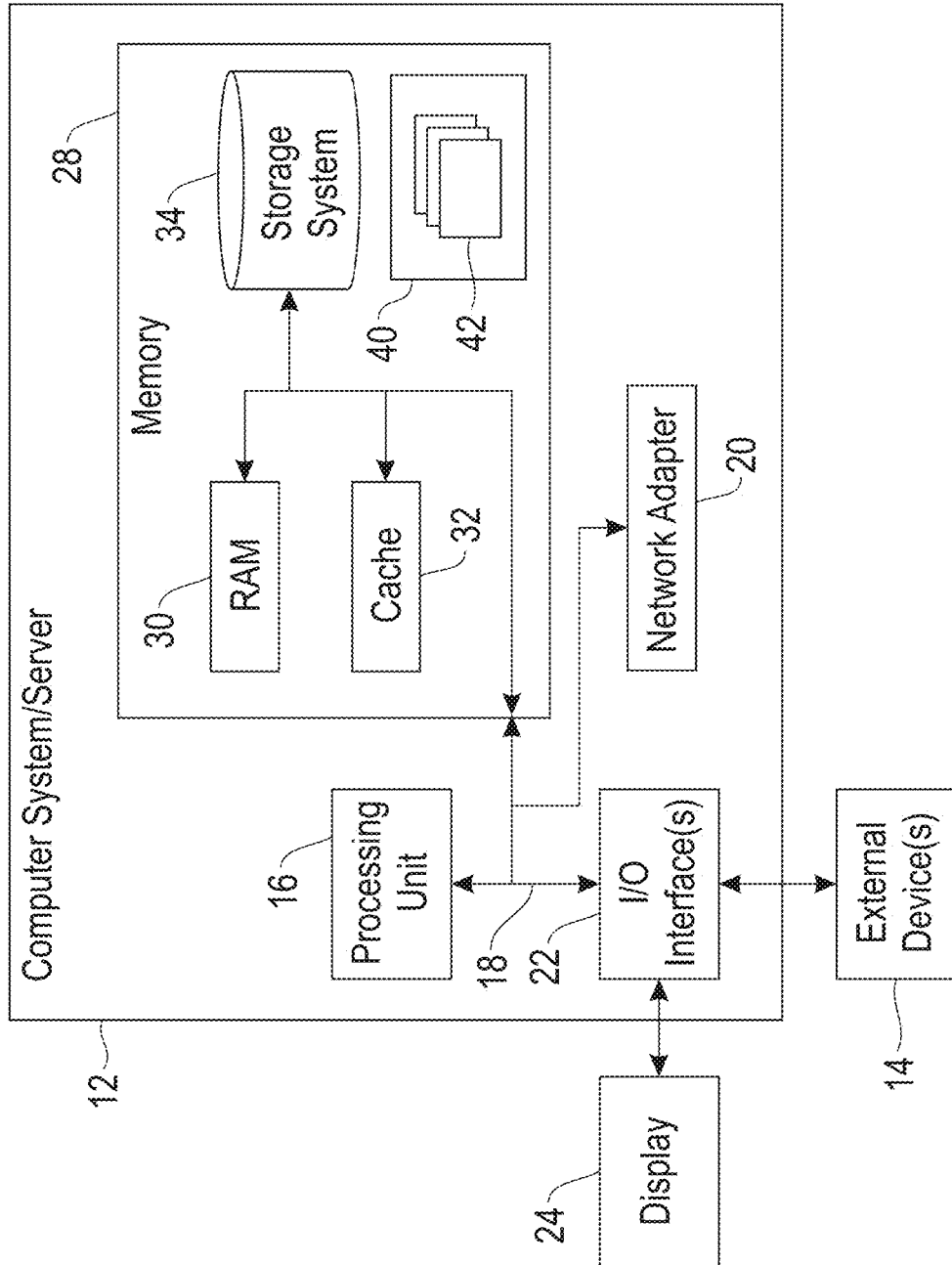
FIG. 18 depicts a computing node according to an embodiment of the present disclosure.

Referring now to FIG. 18, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 18, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a ring buffer comprising a plurality of memory cells, each memory cell of the plurality of memory cells comprising one or more neurosynaptic core;
   a demultiplexer operatively coupled to the ring buffer, the demultiplexer adapted to receive input comprising a plurality of spikes, and write sequentially to each of the plurality of memory cells;
   a plurality of output connectors operatively coupled to the ring buffer, each of the plurality of output connectors adapted to provide an output based on contents of a subset of the plurality of memory cells.

2. The system of claim 1, wherein the ring buffer is configurable at runtime.

3. The system of claim 1, wherein the number of memory cells in the ring buffer is configurable at runtime.

4. The system of claim 1, configured to retain input data for a predetermined number of ticks.

5. The system of claim 4, wherein the predetermined number of ticks is configurable at runtime.

6. The system of claim 1, configured to produce an input window at a predetermined frequency.

7. The system of claim 6, wherein the predetermined frequency is configurable at runtime.

8. The system of claim 1, configured to simultaneously output a predetermined number of prior windows.

9. The system of claim 8, wherein the predetermined number is configurable at runtime.

10. The system of claim 1, wherein an input size of the demultiplexer is configurable at runtime.

11. The system of claim 1, wherein said writing includes a predetermined delay.

12. The system of claim 11, wherein the predetermined delay is configurable at runtime.

13. The system of claim 1, wherein the ring buffer is queried periodically to provide the output.

14. The system of claim 1, wherein the ring buffer is queried upon receipt of an external read signal to provide the output.

15. The system of claim 1, further comprising:
   a sensor adapted to produce output spikes and operatively coupled to the demultiplexer.

16. The system of claim 15, wherein the sensor comprises a spiking camera.

17. The system of claim 1, wherein providing the output comprises computing a BUSor.

18. The system of claim 1, wherein the output comprises a plurality of spikes.

19. The system of claim 1, wherein the demultiplexer is adapted to write sequentially to the plurality of memory cells of the ring buffer simultaneously with the plurality of output connectors providing the output from the ring buffer.

20. A method comprising:
   receiving input comprising a plurality of spikes at a demultiplexer;
   writing by the demultiplexer sequentially to each of a plurality of memory cells of a ring buffer, each memory cell of the plurality of memory cells comprising one or more neurosynaptic core;
   providing an output based on contents of a subset of the plurality of memory cells at a plurality of output connectors.

21. A system comprising:
   a computing node comprising a computer readable storage medium having program instructions embodied therewith, the program instructions executable by a processor of the computing node to cause the processor to perform a method comprising:
      receiving input comprising a plurality of spikes at a demultiplexer;
      writing by the demultiplexer sequentially to each of a plurality of memory cells of a ring buffer, each memory cell of the plurality of memory cells comprising one or more neurosynaptic core;
      providing an output based on contents of a subset of the plurality of memory cells at a plurality of output connectors.

* * * * *